US008629395B2

(12) United States Patent
Morishita et al.

(10) Patent No.: US 8,629,395 B2
(45) Date of Patent: Jan. 14, 2014

(54) CHARGED PARTICLE BEAM APPARATUS

(75) Inventors: Hideo Morishita, Hachioji (JP); Michio Hatano, Hitachinaka (JP); Takashi Ohshima, Saitama (JP); Mitsugu Sato, Hitachinaka (JP); Tetsuya Sawahata, Hitachinaka (JP); Sukehiro Ito, Hitachinaka (JP); Yasuko Aoki, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/521,273

(22) PCT Filed: Jan. 12, 2011

(86) PCT No.: PCT/JP2011/050357
§ 371 (c)(1),
(2), (4) Date: Jul. 10, 2012

(87) PCT Pub. No.: WO2011/089955
PCT Pub. Date: Jul. 28, 2011

(65) Prior Publication Data
US 2012/0298864 A1    Nov. 29, 2012

(30) Foreign Application Priority Data
Jan. 20, 2010 (JP) .................. 2010-009957

(51) Int. Cl.
*H01J 37/28* (2006.01)
*H01J 37/244* (2006.01)
*G01N 23/22* (2006.01)

(52) U.S. Cl.
CPC .............. *H01J 34/28* (2013.01); *H01J 37/244* (2013.01)
USPC ........... 250/310; 250/305; 250/306; 250/307; 250/311; 250/397

(58) Field of Classification Search
CPC ......... H01J 37/05; H01J 37/28; H01J 37/244; H01J 2237/2248; H01J 2237/24465; H01J 2237/24495; G01N 23/203; G01R 31/305
USPC ......... 250/305, 306, 307, 310, 311, 397, 398, 250/396 R
See application file for complete search history.

(56) References Cited

U.S. PATENT DOCUMENTS 3,908,124 A * 9/1975 Rose .............................. 250/311
4,897,545 A * 1/1990 Danilatos ..................... 250/310
(Continued)

FOREIGN PATENT DOCUMENTS

JP        59-197881 A     11/1984
(Continued)

OTHER PUBLICATIONS

Corresponding International Search Report with English Translation dated Mar. 15, 2011 (five (5) pages).
(Continued)

*Primary Examiner* — David A Vanore
(74) *Attorney, Agent, or Firm* — Crowell & Moring LLP

(57) ABSTRACT

In order to provide a charged particle beam apparatus that can detect charged particle beam signals in discrimination into a plurality of energy bands, and obtain high-resolution images for each of the energy bands using the signals, the charged particle beam apparatus has a charged particle source (12-1); an aperture (16) that limits the diameter of the charged particle beam (4); optics (14, 17, 19) for the charged particle beam; a specimen holder (21); a charged particle detector (40) that detects secondary charged particles and reflected charged particles from a specimen; and signal calculation unit that processes the output signal from the charged particle detector. The charged particle detector (40) is provided with a first small detector (51) having a first detection sensitivity and a second small detector (52) having a second detection sensitivity, and makes the detection solid angle viewed from a position on the specimen, to which the charged particle beam (4) is to be radiated, to be the same for the first small detector (51) and the second small detector (52).

17 Claims, 15 Drawing Sheets

(56) References Cited

U.S. PATENT DOCUMENTS

| | | | |
|---|---|---|---|
| 5,644,132 A * | 7/1997 | Litman et al. | 250/310 |
| 5,990,483 A | 11/1999 | Shariv et al. | |
| 6,399,945 B1 * | 6/2002 | Hirayanagi | 250/310 |
| 6,646,262 B1 | 11/2003 | Todokoro et al. | |
| 7,276,694 B1 * | 10/2007 | Bertsche | 250/311 |
| 7,449,690 B2 * | 11/2008 | Nishiyama et al. | 250/310 |
| 7,544,937 B2 * | 6/2009 | Frosien | 250/310 |
| 7,705,302 B2 * | 4/2010 | Aoki et al. | 250/310 |
| 7,947,951 B2 * | 5/2011 | Khursheed | 250/305 |
| 8,334,512 B2 * | 12/2012 | Luecken et al. | 250/311 |
| 8,497,476 B2 * | 7/2013 | Hatakeyama et al. | 250/310 |
| 2001/0048075 A1 * | 12/2001 | Frosien | 250/307 |
| 2010/0200750 A1 | 8/2010 | Mantz et al. | |
| 2011/0233399 A1 | 9/2011 | Ichimura et al. | |
| 2011/0291007 A1 * | 12/2011 | Wang et al. | 250/307 |
| 2012/0037802 A1 * | 2/2012 | Kneedler | 250/307 |
| 2012/0298864 A1 * | 11/2012 | Morishita et al. | 250/310 |
| 2013/0214156 A1 * | 8/2013 | Kneedler et al. | 250/307 |

FOREIGN PATENT DOCUMENTS

| | | |
|---|---|---|
| JP | 10-283978 A | 10/1998 |
| JP | 11-160438 A | 6/1999 |
| JP | 2000-252330 A | 9/2000 |
| JP | 2006-114426 A | 4/2006 |
| JP | 2008-198405 A | 8/2008 |
| JP | 2008-198471 A | 8/2008 |
| JP | 2010-135072 | 6/2010 |
| JP | 2010-182679 A | 8/2010 |
| WO | WO 01/075929 A1 | 10/2001 |

OTHER PUBLICATIONS

Form PCT/ISA/237 (four (4) pages).

* cited by examiner

CHARGED PARTICLE BEAM APPARATUS

TECHNICAL FIELD

The present invention relates to charged particle beam apparatuses, and more particularly to a charged particle beam apparatus including a signal detector that detects signal charged particles generated from an irradiated position through energy discrimination, when charged particles, which work as probes, are irradiated to a specimen.

BACKGROUND ART

Charged particle beam apparatus that irradiates charged particles as probes to a specimen and obtains specimen information about an irradiated position by detecting charged particles generated from the irradiated position have been widespread. Well known as a very commonly used charged particle apparatus is a scanning electron microscope (SEM), in which two-dimensional scanning is performed on a specimen using an electron beam probe converged onto the specimen, and then by detecting secondary electrons and backscattered electrons generated from irradiated positions, and by mapping signals about the amount of detected electrons in synchronization with the scanning of the probe, a two-dimensional image of the scanning region can be obtained. Plural techniques concerning a scanning electron microscope in which signal electrons are detected through energy discrimination (classification) in order to emphasize a desired contrast such as a concave-convex contrast or a composition contrast are disclosed in the following five patent literatures.

CITATION LIST

Patent Literature

Patent Literature 1: International Publication WO 01/075929
Patent Literature 2: Japanese Unexamined Patent Application Publication No. 2008-198471
Patent Literature 3: Japanese Unexamined Patent Application Publication No. 2006-114426
Patent Literature 4: Japanese Unexamined Patent Application Publication No. Hei11-160438
Patent Literature 5: Japanese Unexamined Patent Application Publication No. Sho59(1984) 197881

SUMMARY OF INVENTION

Technical Problem

As for technologies concerning a scanning electron microscope (charged particle beam apparatus), technologies to obtain high-resolution images have been mainly developed so far. During such technological developments, the inventors of the present invention have found that useful information can be obtained by detecting secondary electrons and backscattered electrons through discriminating energies of those electrons into plural energy bands under the condition that high-resolution images can be obtained. Some examples of the related technologies the inventors have been examined are as follows.

Patent Literature 1 discloses a technique in which energy discrimination is performed by deflecting detection-targeted electrons from the axis. In this technique, a means to apply an electric field or a magnetic field to the track axis of signal electrons, and a detector disposed out of the track axis of the signal electrons are employed, and only electrons with a desired energy are deflected to the detector by the electric field or the magnetic field in order for the electrons with a desired energy to be detected by the detector.

Patent Literatures 1 and 2 disclose techniques in which an electrostatic retarding field to decelerate detection-targeted electrons is installed on the track of the detection-targeted electrons to discriminate energies of the detection-targeted electrons. In these techniques, a mesh-shaped electrode is installed on the track of the signal electrons. An electrostatic retarding field is generated by applying a voltage to this meshed electrode, and this electrostatic retarding field shields electrons on the track that have energies less than a desired energy.

In addition, Patent Literature 5 discloses another technique in which energy discrimination is performed with the use of a detector and a thin film. In this technique, a thin film that changes its thickness stepwise is formed in axisymmetrically on the detector plane of the detector. This technique enables the high pass detection of high-speed electrons. The film thickness of the thin film that changes stepwise becomes thinner as a measuring point of the thickness moves outward, and hence the energy attenuation amount that a signal electron given by the thin film does not depend on the zenith angle of the signal electron.

Patent Literature 4 discloses another technique in which a thin film is installed between the detector plane of a detector and a specimen. In this technique disclosed by this literature, the thin film is installed between the detector plane of a MCP (micro channel plate) detector, which is a kind of an electron detector, and the specimen. The objective of installing the thin film is to make it possible that the MCP, which has a maximum sensitivity at a low-energy about 300 eV, effectively detects high-energy electrons. A high-energy electron runs into the MCP from the sensitive side of the MCP after being energetically attenuated by the thin film. Or the high-energy electron is converted into a secondary electron with an ultralow-energy (<100 eV) at the side of the detector plane of the MCP. This literature argues that the ultra low energy electron obtained by the above conversion is detected with a high sensitivity, which enables the high-energy electron to be effectively detected by the MCP.

As for techniques described in the above patent literatures, however, Patent Literature 1 discloses the detector that is considered to work as an energy low pass filter that detects only electrons with an energy, for example, less than 100 eV, while Patent Literatures 2, 3, 4, and 5 disclose the detectors that work as energy high pass filters. Therefore, an energy band pass filter image (an image in the middle energy band obtained by detecting secondary electrons and backscattered electrons through discriminating those electrons into plural energy bands) cannot be realized.

The object of the present invention is to provide a charged particle apparatus that is capable of detecting charged particle signals through discriminating the charged particle signals into plural energy bands, and capable of obtaining a high-resolution image for each energy band using these charged particle signals.

Solution to Problem

An embodiment of the present invention to achieve the above object is a charged particle beam apparatus including: a charged particle source to generate a charged particle beam that works as a probe; an aperture to limit the diameter of the particle beam; an optics for the charged particle beam; a specimen holder on which a specimen, to which the charged particle beam is to be irradiated, is mounted; a charged particle detector to detect secondary charged particles and backscattered charged particles from a specimen; and a signal calculation unit to process an output signal from the charged particle detector. In addition, the charged particle detector includes a first small detector having a first detection sensitivity and a second small detector having a second detection sensitivity higher than the first detection sensitivity, and the charged particle detector makes detection solid angles viewed from a position on the specimen, to which the charged particle beam is to be irradiated, for the first small detector and for the second small detector to be the same.

Advantageous Effects of Invention

The charged particle beam apparatus configured as above is capable of detecting charged particle signals through discriminating the charged particle signals into plural energy bands, and capable of obtaining a high-resolution image for each energy band using these charged particles.

DESCRIPTION OF EMBODIMENTS

Figure 1:
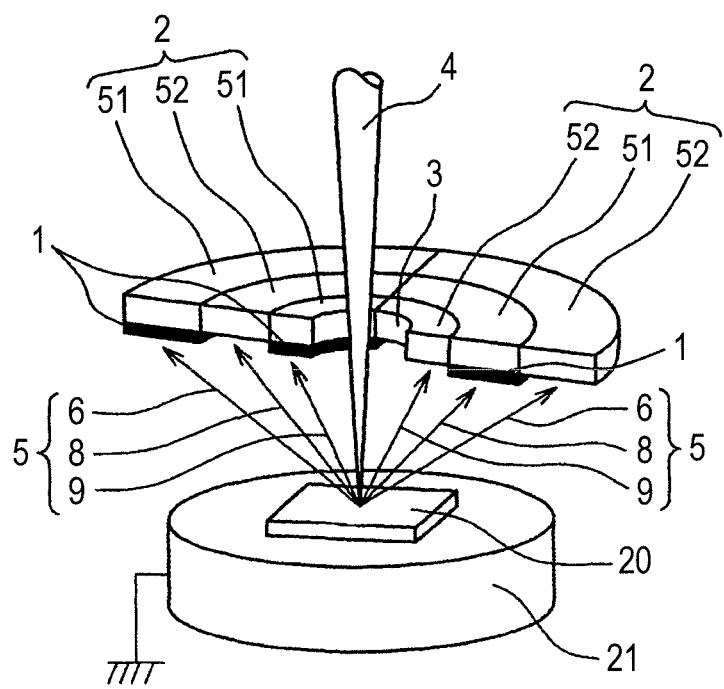
FIG. 1 is a perspective view showing the fundamental configuration of an electron detector employed by a scanning electron microscope according to a first embodiment.

Charged particle signals with high energies can be obtained by detecting charged particles that pass, for example, through a thin film formed on the surface of a detector. Charged particle signals with middle energies are obtained by subtracting the charged particle signals with high energies from charged particle signals with middle and more than middle energies. By this operation, the charged particle signals with middle energies can be obtained, and high-resolution images can be obtained from these charged particle signals. In this case, useful information cannot be obtained by simply subtracting the charged particle signals with high energies from the charged particle signals with middle and more than middle energies. A key point is how to detect signal charged particles with high energies and signal charged particles with middle and more than middle energies.

In order to obtain the useful information by subtracting the charged particle signals with high energies from the charged particle signals with middle and more than middle energies, the following two requirements must be satisfied. The two requirements are: (1) The signal charged particles that have high energies and the signal charged particles that have middle energies and more than middle energies must be obtained at the same time; and (2) Detection solid angles, viewed from the position where charged particle beam is irradiated, of a detector for the signal charged particles that have high energies and a detector for the signal charged particles that have middle and more than middle energies must be made to be the same.

In the embodiments of the present invention, an example of a charged particle beam apparatus that satisfies the above requirements (1) and (2) has plural detectors disposed in a bilaterally symmetrical fashion in the same plane. With this configuration, signals within plural energy regions can be detected at the same time at positions that can be considered equivalent to each other.

For example, it will be assumed that the charged particle beam apparatus includes a detector that detects signal charged particles with energies about 200 eV or more, in which the detector includes plural small electron detectors and one or more of the plural small detectors respectively have the detecting surfaces on which thin films of film thickness 10 nm to 100 μm are formed. Considering any pair of small detectors that have the equivalent detection solid angles among the plural small detectors, one small detector of the pair and the other detector of the pair have different energy sensitivities owing to the presence or absence of a thin film, the difference between thin film materials, and the like. In addition, the charged particle beam apparatus includes a signal processing system that performs calculation processing on signals output from the small detectors.

Owing to the above configuration of the charged particle beam apparatus, detection-targeted charged particles can be detected through discriminating the energies of the charged particles, and, while taking a desired energy into consideration, images after energy high pass filtering, images after energy band pass filtering, and images after energy low pass filtering can be also obtained at the same time.

Generally speaking, at the deeper position a signal electron, which is emitted from a specimen while bearing an energy of 200 eV or more and detected by a detector, is emitted, the lower energy the signal electron has. In other words, information about the depth of a position where the specimen resides can be extracted from an image on which energy band pass filtering is performed in terms of energy. By selecting an energy band used as the pass band (by selecting an energy band corresponding to the pass band of the energy band pass filtering), a depth from which information is wanted to be extracted can be selected.

The present invention will be described in detail with reference to the embodiments hereinafter.

First Embodiment

A first embodiment will be described with reference to FIG. 1 to FIG. 12.

FIG. 1 is a diagram showing an annular-type solid state detector that includes small detectors whose detector planes' shapes are respectively shapes obtained by dividing a circle by concentric circles and radial lines in the same plane. The small detectors of this embodiment can be classified into small detectors that are covered with thin films of the same type and the same film thickness and small detectors that are not covered with thin films. Solid state detectors can be produced in a similar method to photo diodes, and the bulk production of solid state detectors can be made. Therefore, small detectors included in a detector can be produced in a way that they have the same detection characteristics.

Hereinafter, it will be assumed for convenience of explanation that electrons that have energies less than 100 eV, typically a few electron volts, are referred to as ultra low energy electrons, electrons that can pass through the thin film covering the detector plane of a small detector with a thin film among electrons that have energies 100 eV or more and less than or equal to primary electron beam irradiation energy are referred to as high-energy electrons, and electrons that cannot pass through the thin film covering the detector plane of the small detector with a thin film are referred to as low-energy electrons.

Figure 2:
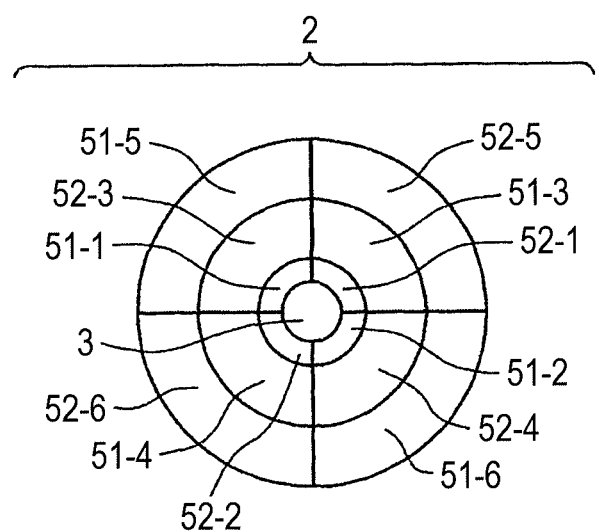
FIG. 2 is a plan view of an example of the detector plane of the electron detector shown in FIG. 1.

In the case where the detector shown in FIG. 1 is viewed from a specimen, the divided patterns of the detector plane of the detector are shown in FIG. 2. The detector 2 includes a central hole 3 through which a primary electron beam 4 passes, small detectors with a thin film 51 (51-1 to 51-6) and small detectors without a thin film 52 (52-1 to 52-6) that are disposed axisymmetrically about an optical axis. In order to explain groups of small detectors that have the same detection solid angle, the small detectors are respectively given signs A to F. Among the small detectors included in the detector 2, four small detectors nearest to the central hole 3, that is, the small detector with a thin film A 51-1, the small detector with a thin film D 51-2, the small detector without a thin film A 52-1, and the small detector without a thin film B 52-2 form a small detector group that has the same solid angle. Next, the small detector with a thin film C 51-3, the small detector with a thin film D 51-4, the small detector without a thin film C 52-3, and the small detector without a thin film D 52-4 form a small detector group that has the same solid angle. Lastly, four small detectors farthest from the central hole 3, that is, the small detector with a thin film E 51-5, the small detector with a thin film F 51-6, the small detector without a thin film E 52-5, and the small detector without a thin film F 52-6 form a small detector group that has the same solid angle.

The small detectors are solid state detectors, and the detector planes of the small detectors with a thin film 51 are covered with thin films 1 whose film thicknesses range from 10 nm to 100 µm. The material of this thin film 1 is a conductive material such as Al or Au, but any kind of thin film can also be used as long as the thin film can be formed uniformly on the detecting surface with a film thickness and a material property that allow an electron to pass from the surface of the thin film 1 to the detection detector plane. Thin films of semiconductor materials and insulating materials whose surfaces are covered with conductive films in order to prevent the surfaces from being electrostatically charged can be also used. Here, the film thickness of the thin film 1 can be considered as a uniform film thickness if the film thickness in-plane distribution ranges from minus 10% to plus 10%.

Figure 3:
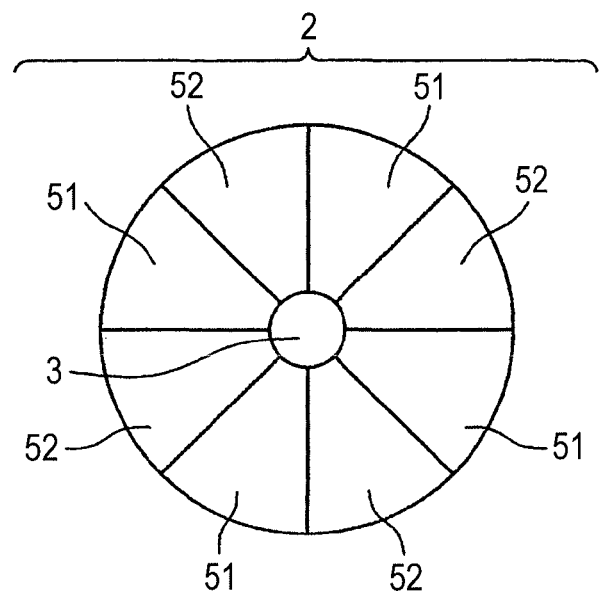
FIG. 3 is a plan view showing another example of the detector plane of the electron detector employed by the scanning electron microscope according to the first embodiment.

The detector 2 is installed so that the central axis of the detector 2 coincides with the optical axis of the primary electron beam (See FIG. 1). The small detectors are disposed on the same plane. Angle discrimination can be also performed depending on how to divide the detecting surface. In this case, the detector plane of the detector is divided in accordance with the detection solid angles to be discriminated. For example, if the angle discrimination is performed regarding the azimuth direction, the surface to be divided is divided by radial lines as shown in FIG. 3. In addition, if the angle discrimination is performed regarding the elevation direction as well as regarding the azimuth direction, the surface to be divided is divided by concentric circles as well as by radial lines as shown in FIG. 2. As for a pair of detector planes of small detectors disposed axisymmetrically about the center of the circle, one detector plane is covered with a thin film, and the other is not covered with the thin film, with the result that, although the small detectors have the same solid angle, they have different energy sensitivities. If it is required that the angle discrimination detection is more minutely performed than above, it is necessary that, while the small detectors are kept to be disposed axisymmetrically, the detector planes are more minutely divided.

Figure 4:
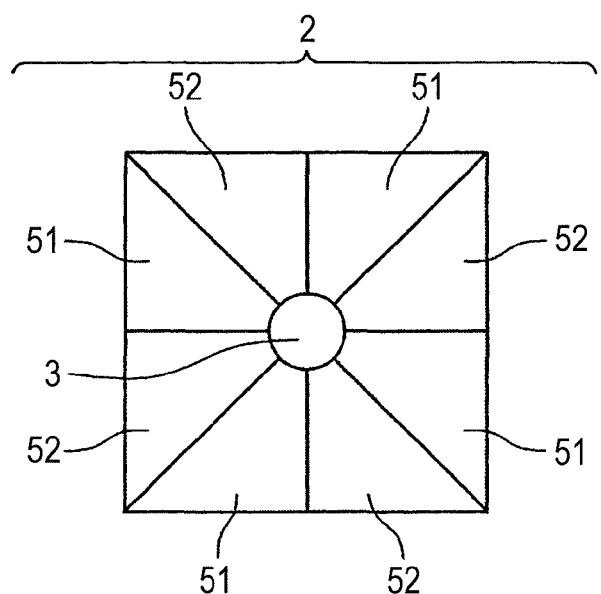
FIG. 4 is a plan view showing another example of the detector plane of the electron detector employed by the scanning electron microscope according to the first embodiment.
Figure 5:
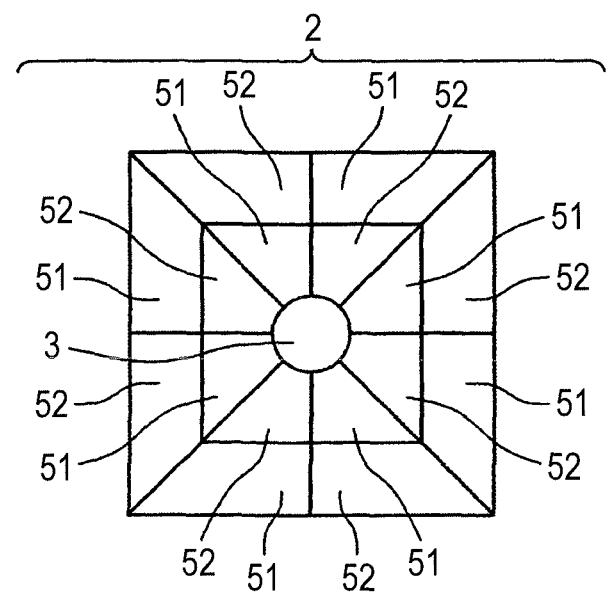
FIG. 5 is a plan view showing another example of the detector plane of the electron detector employed by the scanning electron microscope according to the first embodiment.
Figure 6:
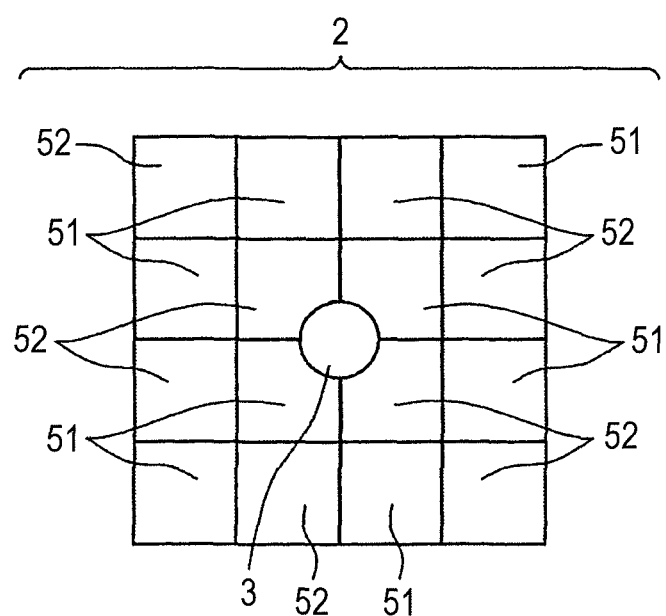
FIG. 6 is a plan view showing another example of the detector plane of the electron detector employed by the scanning electron microscope according to the first embodiment.
Figure 7:
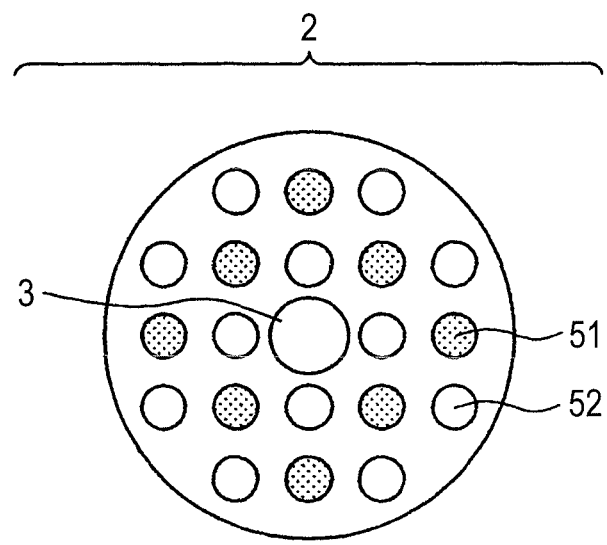
FIG. 7 is a plan view showing another example of the detector plane of the electron detector employed by the scanning electron microscope according to the first embodiment.
Figure 8:
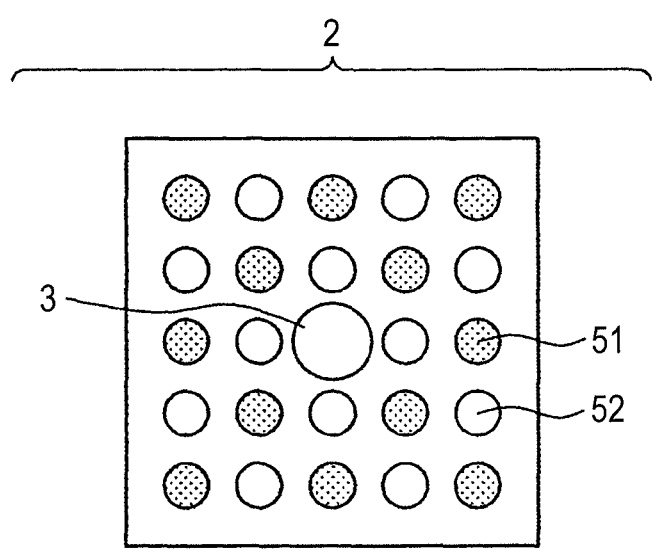
FIG. 8 is a plan view showing another example of the detector plane of the electron detector employed by the scanning electron microscope according to the first embodiment.

The shape of the detection detector plane is not limited to a circle, but the shape can be a quadrangle as shown in FIG. 4, FIG. 5, or FIG. 6, or other shapes such as a hexagon (not shown). In addition, as long as the detection solid angles of small detectors disposed axisymmetrically are the same, divided surfaces that can be used are not limited to the surfaces divided in a segmented fashion as shown in FIG. 2 to FIG. 6, and divided surfaces that form a group of small detectors disposed in an array fashion as shown in FIG. 7 or FIG. 8 can be also used. In this case, two detection solid angles being the same means that, when comparing the two solid angles each of which is determined by a specimen and the area of a detection detector plane corresponding to each of the solid angles, the difference between the two detection solid angles is within 5% or within 10%.

As for methods for giving different energy sensitivities to the small detectors, there are, for example, two types of methods described below.

Figure 9:
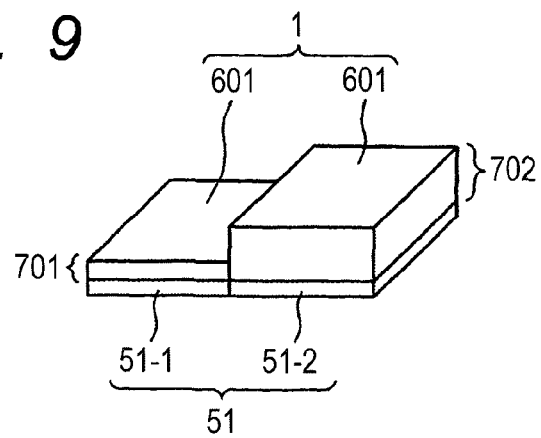
FIG. 9 is a layout drawing of two small detectors that have different energy sensitivities and that are employed by the scanning electron microscope according to the first embodiment.

A first method will be described with reference to FIG. 9. FIG. 9 is a diagram showing an example of method in which the difference between the energy sensitivities of two small detectors with a thin film 51 is realized using two thin films that have the same components but different film thicknesses. The material 601 of the thin film 1 of the small detector A 51-1 is the same as the material 601 of the thin film 1 of the small detector B 51-2. The film thickness 701 of the thin film installed in the small detector A 51-1 that can detects lower energy is made thinner than the film thickness 702 of the thin film installed in the small detector B 51-2. Typically, the film thickness 701 of the thin film installed in the small detector A 51-1 is 50 nm, and the film thickness 702 of the thin film installed in the small detector B 51-2 is 1 µm.

Figure 10:
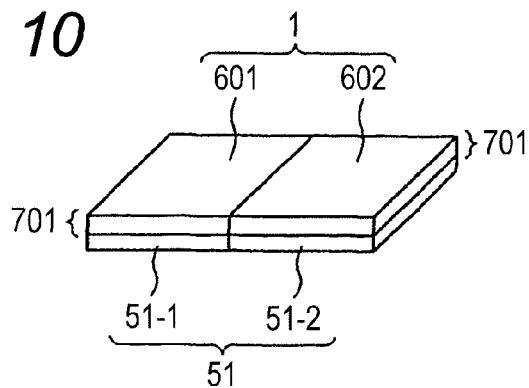
FIG. 10 is another layout drawing of two small detectors that have different energy sensitivities and that are employed by the scanning electron microscope according to the first embodiment.

A second method will be described with reference to FIG. 10. FIG. 10 is a diagram showing an example of method in which the difference between the energy sensitivities of two small detectors with a thin film 51 is realized using two thin films that have almost the same film thicknesses but different materials or components. The film thickness 701 of the thin film 1 installed in the small detector A 51-1 is the same as the film thickness 701 of the thin film 1 installed in the small detector B 51-2. Here, it will be assumed that two film thicknesses of the thin film can be considered as the same if the difference between the film thicknesses ranges from minus 10% to plus 10%. The blocking capability of a thin film depends on the atomic numbers and densities of elements included in the thin film, and an energy incident on the thin film. The larger the atomic numbers and densities of the elements included in the material of the thin film are, with more difficulty an electron passes through the thin film. The material 601 of the thin film of the small detector A 51-1 is different from the material 602 of the thin film of the small detector B 51-2. Typically, the material 601 of the thin film of the small detector A 51-1 is Al, and the material 602 of the thin film of the small detector B 51-2 is Au, and the blocking capability of the thin film made of the material Au is larger.

Although it is desirable that these thin films 1 are uniformly formed on the detector plane, it will be assumed in this invention that the film thickness of the thin film of a small detector can be considered as a uniform film thickness if the film thickness in-plane distribution ranges from minus 10% to plus 10%.

The principle of an energy discrimination method will be described with reference to FIG. 1. Signal electrons 5 emitted from a specimen 20 fixed on a specimen holder 21 includes high-energy BSE 9, low-energy BSE 8, and ultra low energy electrons 6. Here, the directions of arrows are respectively examples of the moving directions of the electrons with the above energies, and these electrons are emitted not only in the above directions shown by the arrows but also in many other directions.

First, the detection behavior performed by the small detectors 52 and 51 will be described in association with electrons 9, 8 and 6. The high energy BSE (backscattered electron with high energy) 9 and low energy BSE (backscattered electron with low energy) 8 are detected by the small detector 52 without thin film, but the ultra low energy electrons 6 are not detected because the small detector 52 has no sensitivity to detect the ultra low energy electrons 6. At the small detector 51 with a thin film, the high energy BSE 9 pass through the thin film 1, reach the sensitive region of the small detector 51 with a thin film, and the high energy BSE 9 are detected; the low energy BSE 8 lose energies while travelling in the thin film 1, and hence the low energy BSE 8 are not detected; and the ultra low energy electrons 6 lose energies just after entering the surface of the thin film 1, and hence the ultra low energy electrons 6 are not detected.

In other words, the high-energy electrons are detected by both small detector 51 with a thin film and small detector 52 without a thin film. The low-energy electrons are detected by the small detector 52 without a thin film and are not detected by the small detector 51 with a thin film. Neither small detector can detect the ultra low energy electrons 6.

The detector including the small detectors 51 with a thin film and the small detectors 52 without a thin film, in which an energy sensitivity the small detector 51 has is different from that the small detector 52 has, has been described so far. However, a detector that has an arbitrary number of small detectors having energy sensitivities different from each other will do, as long as the detector has two or more types of small detectors having different energy sensitivities from each other. For example, if a detector includes two types of small detectors having thin films whose film thicknesses are different from each other, and a small detector without a thin film, the detector can deal with three different energy bands. It is conceivable that a detector, which includes small detectors with a thin film having energy sensitivities different from each other owing to the film thicknesses or materials of their thin films being different, and includes no small detectors without a thin film, will do.

Figure 11:
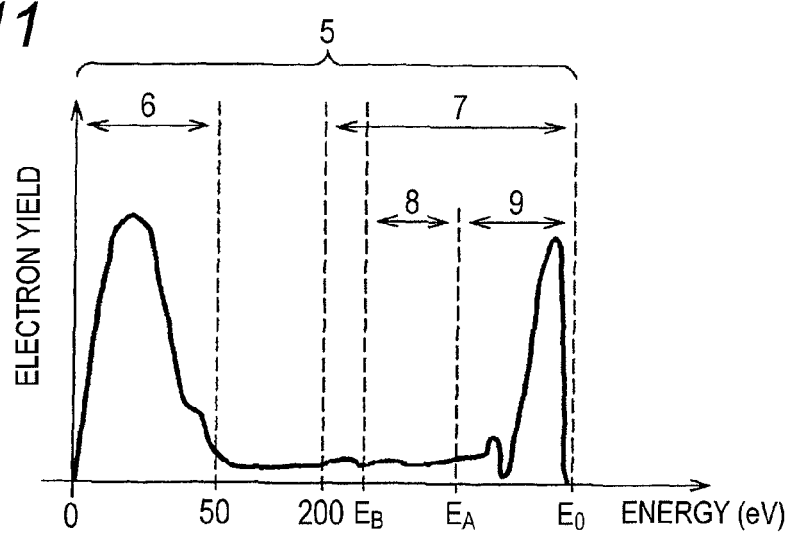
FIG. 11 is a drawing showing a typical energy distribution of emitted electrons.

The energy bands, to which electrons included in the signal electrons 5 emitted from the specimen 20 belong, will be described with reference to FIG. 3 and FIG. 11 hereinafter. Here, it will be assumed that the potential of the specimen 20 is set to the ground. When the primary electron beam 4 is irradiated to the specimen 20, the high energy BSE 9, the low energy BSE 8, and ultra low energy electrons 6 are emitted from a position on the specimen to which the primary electron beam is irradiated. The energy distribution of the signal electrons 5 emitted from the specimen 20 has typically a pattern shown in FIG. 11, in which the energy values of the ultra low energy electrons 6 show a peak in the low-energy side, and the energy values that are almost the same as the energy value of the primary electron beam 4 show a peak in the high-energy side. The energy ranges that can be detected by the detector according to this embodiment can be set, for example, so that high-energy electrons within the energy range $E_A$ to $E_0$ shown in FIG. 11 are detected by the small detector 51 with a thin film shown in FIG. 3, and low-energy electrons and the high-energy electrons within the energy range $E_B$ to $E_0$ shown in FIG. 11 are detected by the small detector 52 without a thin film. In this case, the minimum detectable energy $E_B$ corresponds to the lower limit threshold of the energy sensitivity that the small detector without a thin film itself has. Electrons within the energy range EB to EA are the lower-energy electrons 8 that are shielded by the thin film 1 installed in small detector 51 with a thin film shown in FIG. 3.

A solid state detector used as a small detector without a thin film will be described in detail hereinafter.

The solid state detector usually includes a PN junction or a PIN junction, and when an electron reaches the depletion layer, a pair of an electron and a hole is generated. Each of the generated carriers flows to the corresponding electrode, and is detected as current. In this case, the lower limit threshold of the energy sensitivity detected by the small detector 51 with a thin film shown in FIG. 3 can be controlled by the film thickness or film material of the thin film installed on the detector plane, and therefore the small detector 51 with a thin film and the small detector 52 without a thin film can detect electrons belonging to different energy bands respectively.

For example, if a solid state detector that has the lower limit threshold of energy sensitivity 2 keV is used as a small detector, the small detector 51 with a thin film whose detector plane is covered with an Al thin film 1 of film thickness 50 nm has an energy sensitivity capable of perceiving 3 keV or more, and the small detector 52 without a thin film has an energy sensitivity capable of perceiving 2 keV or more.

How to set the sensitivities of two small detectors with a thin film that have energy sensitivities different from each other will be described hereinafter. In the case where two thin films 1 that have the same film thicknesses and different components are used for the thin films 1 of two small detectors 51 with a thin film, a solid state detector that has the lower limit threshold of energy sensitivity 2 keV is used as a small detector for each of the two small detectors, and an Al thin film that has the film thickness of 50 nm is installed on the detector plane of one small detector (a small detector A 51-1 with a thin film), while an Au thin film that has the film thickness of 50 nm is installed on the detector plane of the other small detector (a small detector A 51-2 with a thin film), which enables the small detector A 51-1 with a thin film to have an energy sensitivity capable of perceiving 2 keV or more, and the small detector A 51-2 with a thin film to have an energy sensitivity capable of perceiving 9 keV or more.

In the case where two thin films 1 that have different film thicknesses and the same components are used for the thin films 1 of two small detectors 51 with a thin film, a solid state detector that has the lower limit threshold of energy sensitivity 2 keV is used as a small detector, and an Al thin film that has the film thickness of 50 nm is installed on the detector plane of one small detector (a small detector A 51-1 with a thin film), while an Au thin film that has the film thickness of 10 µm is installed on the detector plane of the other small detector (a small detector A 51-2 with a thin film), which enables the small detector A 51-1 with a thin film to have an energy sensitivity capable of perceiving 2 keV or more, and the small detector A 51-2 with a thin film to have an energy sensitivity capable of perceiving 13 keV or more.

In the above example, the description has been made under the assumption that a solid state detector is used as a small detector for the two small detectors, but, needless to say, not only the solid state detector but also other types of detectors, for example, a detector having an avalanche multiplication mechanism can also be used in this embodiment. An advantage of using a detector including an avalanche multiplication mechanism is as follows. Although the energy sensitivity of a small detector 51 with a thin film can be changed by installing a thin film 1 on the detection detector plane of the small detector 51, an electron loses a gain corresponding to an energy the electron loses when passing through the thin film 1, which leads to a decrease in the detection yield. Therefore, the detector including the avalanche multiplication mechanism is useful for securing signal to noise ratios of signal images because the detector has a high gain. A detector for low energy electrons typically used for a scanning electron microscope and used for detecting ultra low energy electrons can be also used as a small detector. This detector for low energy electrons includes a scintillator that converts signal electrons into lights, and a photomultiplier tube that converts the lights into electrons again to increase the number of electrons. This detector for low energy electrons includes a scintillator film applied to the detector plane thereof, and a metal thin film at the electron incident side thereof.

When this detector for low energy electrons is used, a voltage about 10 kV is applied to the metal thin film. An ultra low energy electron, a low-energy electron, and a high-energy electron are all accelerated, reach the detector plane of the detector, and pass through the metal thin film to brighten the scintillator. When the above detector for low energy electrons is used as a small detector 51 with a thin film, the voltage is not applied to the metal thin film in order not to influence the track and the energy of a signal electron to be detected, and the film thickness of the Al thin film of the detector plane is changed in order to change the energy sensitivity of the detector. A similar approach can be applied to a YAG detector that uses YAG as a scintillator material.

Other detectors such as a MCP (micro channel plate) or a fluorescent screen can also be used as a small detector. Alternatively, a combination of the above detectors can be also used.

In the detection of electrons among the signal electrons 5 emitted from the specimen, by configuring a detector in many ways as described above, the electrons belonging to plural energy bands can be detected at the same time, and the energy sensitivity of the detector can be changed by changing the film thickness of the thin film 1. In addition, it is also possible to enable the detector to perform angle discrimination detection regarding the azimuth direction and elevation direction by contriving the shape of the detection detector plane and the divided patterns of the detection detector plane.

Figure 12:
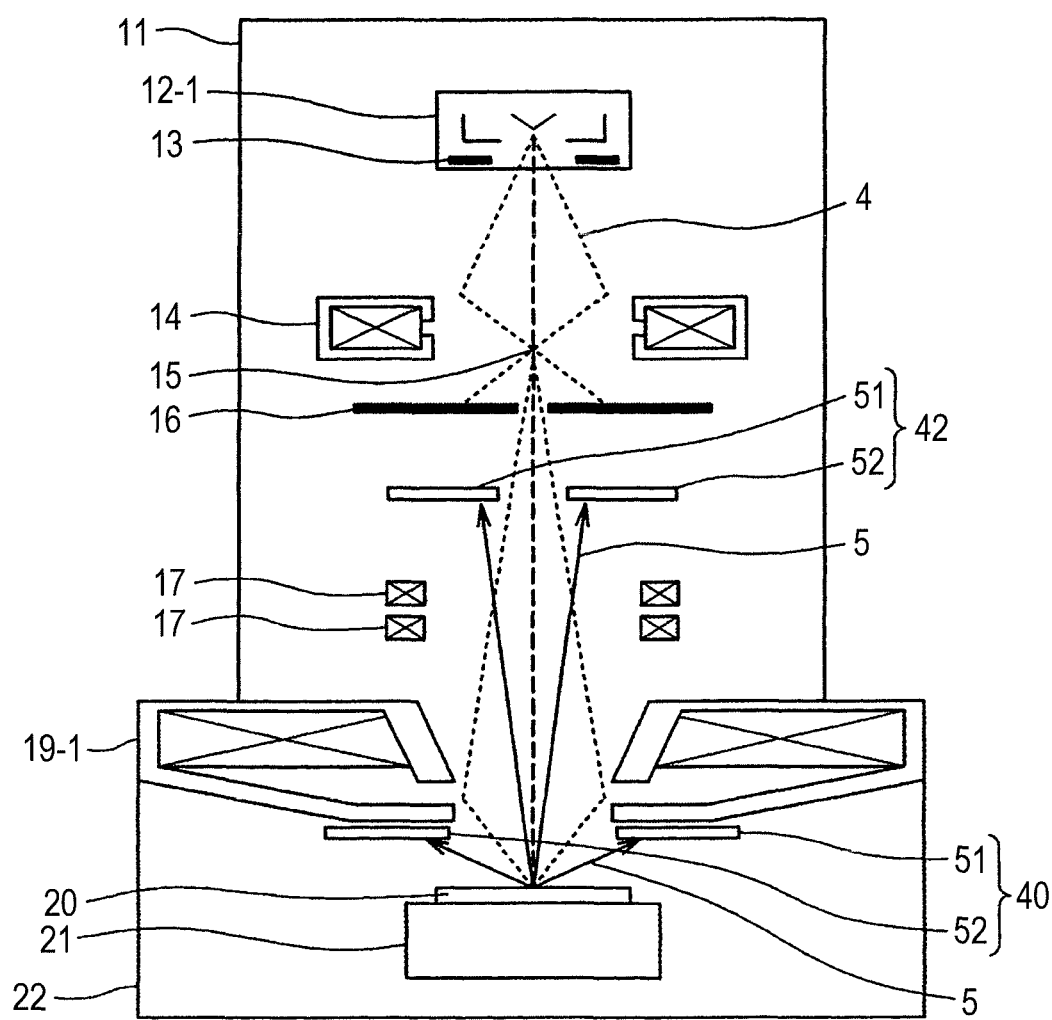
FIG. 12 is a schematic cross-section view of the scanning electron microscope according to the first embodiment.

FIG. 12 is a drawing showing the entire configuration of a scanning electron microscope including a detector capable of simultaneously detecting electrons belonging to plural energy bands with the use of separate small detectors that are components of the detector.

The scanning electron microscope shown in FIG. 12 includes mainly an electron optics column 11 having a mechanism for irradiating an electron beam to a specimen; a specimen holder 21 for holding the specimen 20; a specimen chamber 22 for housing the specimen holder 21; an information processing unit (not shown) that performs control processing, calculation, a variety of image processing, or information processing about user interfaces; a display terminal (not shown) that displays images observed by the scanning electron microscope; and an image memory.

The electron optics column 11 fundamentally includes an electron gun 12 (12-1); a condenser lens 14; a double scan deflector 17; an objective lens 19 (19-1); and the like. Although a Schottky emission type electron gun 12-1 or a tungsten thermal electron gun is typically used as the electron gun 12, any other electron gun such as an $LaB_6$ electron gun or a cold-cathode electric field emission-type electron gun can also be used. Here, a reference sign 13 shows an acceleration electrode.

The objective lens shown in FIG. 12 is an out-lens type objective lens 19-1. The primary electron beam 4 emitted from the electron gun 12-1 has typically an energy ranging from 100 eV to 200 eV. This primary electron 4 is converged to a crossover 15 under the condenser lens 14, and passes through an aperture 16. At this time, unnecessary regions of the primary electron beam 4 are removed by the aperture 16. The primary electron beam 4 having passes through the aperture 16 is converged onto the specimen 20 by the objective lens 19-1. The double scan deflector 17 is disposed between the condenser lens 14 and the objective lens 19-1, and the double scan deflector 17 two-dimensionally scans the position of the crossover of the primary electron beam 4 on the specimen 20 in accordance with a desired visual field range/magnification.

By the irradiation of the primary electron beam 4, signal electrons 5 with various energies are generated from the specimen 20. Hereinafter, it will be assumed that, in the case where the potential of the specimen 20 is set to the ground, among the signal electrons 5 emitted from the specimen 20, electrons that have energies to enable the electrons to pass through the thin film installed on the detector plane of the small detector with a thin film are referred to as high-energy electrons, and electrons that do not have energies to enable the electrons to pass through the thin film installed on the detector plane of the small detector with a thin film are referred to as low-energy electrons.

The detector 2 includes the small detectors whose detector planes are disposed in the same plane, and as shown in FIG. 12, two detectors 2 are disposed perpendicular to the optical axis respectively between the specimen 20 and the objective lens 19-1 and between the objective lens 19-1 and the aperture 16. In this case, two detection detector planes being on the same plane means that the distance between the two detection detector planes is within 1 mm or within 5 mm, and a detector being perpendicular to the optical axis means that the angle between the detection detector plane of the detector and the optical axis is within 90°−10° to 90°+10°. The detector 2 is typically a detector shown in FIG. 2, but any of detectors shown in FIG. 2 to FIG. 8 can be the detector 2, as long as the detector includes small detectors that have the same detection solid angles and different energy sensitivities. In addition, any detector having a detector plane the shape and the divided patterns of which are pursuant to those of any of the above detectors can be the detector 2. Hereinafter, it will be assumed that a detector 2 disposed between the specimen 20 and the objective lens 19-1 is referred to as a detector L 40, and that a detector 2 disposed between the objective lens 19-1 and the aperture 16 is referred to as a detector U 42.

The signal electrons 5 emitted from the specimen 20 move from the surface of the specimen 20 to the electron gun 12-1. Here, the zenith angle of an electron emitted from the specimen 20 will be defined in the style of a three-dimensional spherical coordinate system. To put it concretely, it will be defined that the angle of a direction that is normal to the surface of the specimen 20 is 0°, and the angle of a direction that is horizontal to the surface of the specimen 20 is 90°. In this embodiment, in the case where the surface of the specimen 20 is disposed perpendicular to the optical axis, it will be assumed that signal electrons 5 emitted with their zenith angles 0° to 90° are targeted for detection. In this case, signal electrons 5 targeted for detection by the detector L 40 are the signal electrons 5 emitted with large zenith angles, that is, nearly 90°. On the other hand, signal electrons 5 targeted for detection by the detector U 42 are the signal electrons 5 emitted with small zenith angles, that is, nearly 0°.

The following description will be made under the assumption that both detector L 40 and detector U 42 includes small detectors with two types of energy sensitivities, that is, small detectors 51 with a thin film and small detectors 52 without a thin film.

The small detector 52 without a thin film included in the detector L 40 detects low-energy electrons as well as high-energy electrons among signal electrons 5 emitted with large zenith angles. The small detector 51 with a thin film included in the detector L 40 detects only high-energy electrons among the signal electrons 5 emitted with large zenith angles. In a similar way, the small detector 52 without a thin film included in the detector U 42 detects low-energy electrons as well as high-energy electrons among signal electrons 5 emitted with small zenith angles, and the small detector 51 with a thin film included in the detector U42 detects only high-energy electrons among the signal electrons 5 emitted with small zenith angles.

Although the above description has been made under the assumption that both detector L 40 and the detector U 42 includes small detectors with two types of energy sensitivities, that is, small detectors 51 with a thin film and small detectors 52 without a thin film, this embodiment is not limited to the above configuration.

If the detector L 40 and the detector U 42 have the shapes of the detector planes and the divided patterns of the detector planes shown in FIG. 3, angle discrimination detection regarding the azimuth direction can be performed, and if the detector L 40 and the detector U 42 have the shapes of the detector planes and the divided patterns of the detector planes shown in FIG. 2, not only the angle discrimination detection regarding the azimuth direction shown in FIG. 3 can be performed but also angle discrimination detections regarding three angle areas of the elevation direction can be performed. Therefore, the discrimination detection regarding the azimuth angle depends on the shape and the divided patterns of the detector plane of the detector, and the discrimination detection regarding energy depends on the installation method of the thin film 1 installed on the detector plane of the small detector 51 with a thin film, and as long as corresponding small detectors have the same detection solid angles, the shapes and the divided patterns of the detector planes of the detector L 40 and the detector U 42 can be freely changed.

As described above, this embodiment includes both detector L 40 and detector U 42, but the configuration that includes either the detector L 40 or the detector U 42 will do.

Because this embodiment employs an out-lens type objective lens as an objective lens, this embodiment has a larger flexibility in terms of the size and the gradient angle of the specimen 20 than after-mentioned embodiments that employ a semi-in-lens type objective lens or an in-lens type objective Lens as an objective lens have. In addition, because, in the case of a Schottky emission type electron gun being used as an electron gun, the amount of irradiated primary electron beams becomes larger compared with the amount of irradiated primary electron beams in the case of other electron sources being used, the former case is more advantageous in terms of signal yields.

Although the above description about this embodiment has been made using a scanning electron microscope, an ion microscope can also be used instead of the scanning electron microscope.

According to this embodiment, the solid angles of the detectors viewed from a position of measuring charged particle signals can be made to be the same, and at the same time signal charged particles having high-energies and middle-energies and more can be obtained. Therefore, a charged particle beam apparatus, which can detect charged particle signals through discriminating the charged particle signals into plural energy bands, and can obtain high-resolution images for each of the energy bands using the signals, can be provided by this embodiment.

Second Embodiment

A second embodiment will be described with reference to FIG. 13. Hereinafter, it will be assumed that items, which have been described in the first embodiment, but will not be described in this embodiment, have the same properties as described in the first embodiment.

Figure 13:
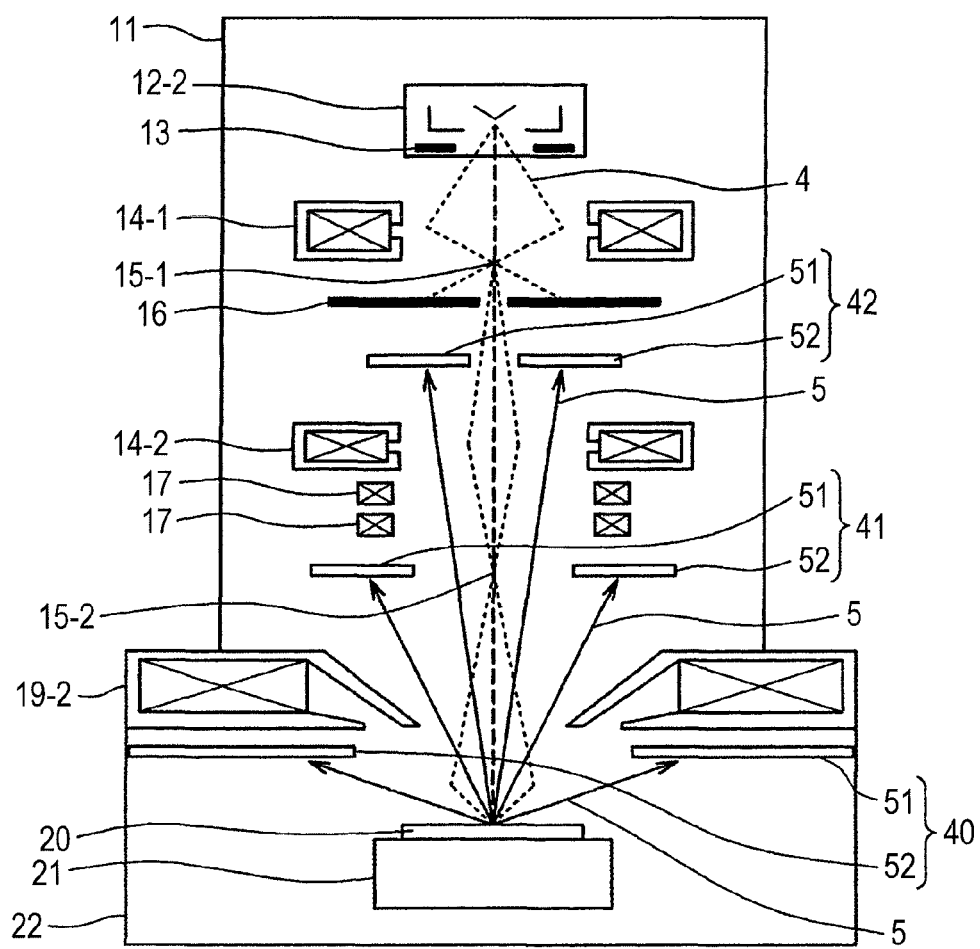
FIG. 13 is a schematic cross-section view of a scanning electron microscope according to a second embodiment.

FIG. 13 is a drawing showing the entire configuration of a scanning electron microscope that can simultaneously detect electrons included in plural energy bands using separate small detectors included as components of the detector of the scanning electron microscope.

The scanning electron microscope shown in FIG. 13 includes mainly an electron optics column 11 having a mechanism for irradiating an electron beam to a specimen; a specimen holder 21 for holding the specimen 20; a specimen chamber 22 for housing the specimen holder 21; an information processing unit (not shown) that performs control processing, a variety of image processing, or information processing about user interfaces; a display terminal (not shown) that displays images observed by the scanning electron microscope; and an image memory.

The electron optics column 11 fundamentally includes an electron gun 12 (12-2); a first condenser lens 14-1; a second condenser lens 14-2; a double scan deflector 17; an objective lens 19 (19-2); and the like. Although a cold-cathode electric field emission-type electron gun 12-2 is typically used as the electron gun 12, any other electron gun such as an $LaB_6$ electron gun, a tungsten thermal electron gun, or a Schottky emission type electron gun can also be used. Here, a reference sign 13 shows an acceleration electrode.

The objective lens shown in FIG. 13 is a semi-in-lens type objective lens 19-2 that purposely immerses the specimen 20 disposed under the lower surface of the lens in an output magnetic field. Compared with in the case where an out-lens type objective lens is used, in the case where a semi-in-lens type objective lens is used, the specimen 20 is disposed in the magnetic immersion field, and therefore an observation of the specimen 20 can be achieved with a higher resolution.

A primary electron beam 4 emitted from the electron gun 12-2 has typically an energy ranging from 100 eV to 200 eV. This primary electron 4 is converged to a first crossover 15-1 under the first condenser lens 14-1, and passes through an aperture 16. At this time, unnecessary regions of the primary electron beam 4 are removed. The position of the first crossover 15-1 is controlled by controlling the first condenser lens 14-1.

The primary electron beam 4 that has passed through the first crossover 15-1 is converged to a second crossover 15-2 under the second condenser lens 14-2. The position of the second crossover 15-2 to which the primary electron beam 4 is converged is controlled by controlling the second condenser lens 14-2.

The primary electron beam 4 that has passed through the second crossover 15-2 is converged to the specimen by the objective lens 19-2. The double scan deflector 17 is disposed between the second condenser lens 14-2 and the objective lens 19-2, and the double scan deflector 17 two dimensionally scans the position of the crossover of the primary electron beam 4 on the specimen 20 in accordance with a desired visual field range/magnification.

By the irradiation of the primary electron beam 4, the signal electrons 5 with various energies are generated from the specimen 20. Hereinafter, it will be assumed that, in the case where the potential of the specimen 20 is set to the ground, among the signal electrons 5 emitted from the specimen 20, electrons that have energies to enable the electrons to pass through the thin film installed on the detector plane of the small detector with a thin film are referred to as high-energy electrons, and electrons that do not have energies to enable the electrons to pass through the thin film installed on the detector plane of the small detector with a thin film are referred to as low-energy electrons.

As shown in FIG. 13, three detectors 2 are disposed perpendicular to the optical axis respectively between the specimen 20 and the objective lens 19-2, between the objective lens 19-2 and the second condenser lens 14-2, and between the second condenser lens 14-2 and the aperture 16. In this case, a detector being perpendicular to the optical axis means that the angle between the detection detector plane of the detector and the optical axis is within 90°−10° to 90°+10°. The detector 2 is typically a detector shown in FIG. 2, but any of detectors shown in FIG. 3 to FIG. 10 can be the detector 2. In addition, any detector having a detector plane the shape and the divided patterns of which are pursuant to those of any of the above detectors can be the detector 2. Hereinafter, it will be assumed that a detector 2 disposed between the specimen 20 and the objective lens 19-2 is referred to as a detector L 40, a detector 2 disposed between the objective lens 19-2 and the second condenser lens 14-2 is referred to as a detector M 41, and a detector 2 disposed between the second condenser lens 14-2 and the aperture 16 is referred to as a detector U 42.

The signal electrons 5 emitted from the specimen 20 move from the surface of the specimen 20 to the electron gun 12-2. Here, the zenith angle of an electron emitted from the specimen 20 is defined in the same style as defined in the first embodiment. In this embodiment, signal electrons 5 emitted with their zenith angles 0° to 90° with respect to the surface of the specimen 20 are targeted for detection. In this case, signal electrons 5 targeted for detection by the detector L 40 are signal electrons 5 emitted with large zenith angles, that is, with angles near to the surface of the specimen 20 (with angles nearly equal to an angle between the normal line of the surface of the specimen 20 and the surface of the specimen 20 or 90°). On the other hand, signal electrons 5 targeted for detection by the detector U 42 are signal electrons 5 emitted with small zenith angles, that is, with angles near to the normal line of the surface of the specimen 20. The signal electrons 5 targeted for detection by the detector M 41 are signal electrons 5 emitted with zenith angles included in a detection solid angle between the detector U 42 and the detector L 40.

If the detector L 40, the detector M 41, and the detector U 42 have the shapes of the detector planes and the divided patterns of the detector planes shown in FIG. 3, the angle discrimination detection regarding the azimuth direction can be performed, and if the detector L 40, the detector M 41, and the detector U 42 have the shapes of the detector planes and the divided patterns of the detector planes shown in FIG. 2, not only the angle discrimination detection regarding the azimuth direction shown in FIG. 3 can be performed but also the angle discrimination detection regarding three angle areas of the elevation direction can be performed.

Therefore, the discrimination detection regarding the azimuth angle can be freely changed by the shape and the divided patterns of the detector plane of the detector, and the discrimination detection regarding energy can be freely changed by the installation method of the thin films 1 installed on the detector planes of the small detectors 51 with a thin film as long as corresponding small detectors have the same detection solid angles.

As described above, this embodiment includes three detectors, that is, the detector L 40, the detector M 41, and the detector U 42, but a configuration that is lacking in any one of the above three detectors will do.

Because this embodiment employs the semi-in-lens type objective lens 19-2 as an objective lens, this embodiment has a larger flexibility in terms of the size and the gradient angle of the specimen 20 disposed under the detector L 40 that is located under the lower surface of the object lens 19-2 as with the first embodiment that employs an out-lens type objective lens, and in addition, this embodiment can perform an observation of the specimen 20 with a higher resolution than the first embodiment that employs the out-lens type objective lens can do.

According to this embodiment, as with the case of the first embodiment, a charged particle beam apparatus that can detect charged particle signals through discriminating the charged particle signals into plural energy bands, and obtain high-resolution images for each of the energy bands using the signals can be provided. In addition, because this embodiment includes the detectors L, M, and U, this embodiment can detect charged particles emitted with a wider range than the first embodiment can do. In addition, by employing a semi-in-lens type objective lens as an objective lens, this embodiment can perform an observation of the specimen 20 with a higher resolution than the first embodiment can do.

Third Embodiment

A third embodiment will be described with reference to FIG. 14. Hereinafter, it will be assumed that items, which have been described in the first embodiment, but will not be described in this embodiment, have the same properties as described in the first embodiment.

Figure 14:
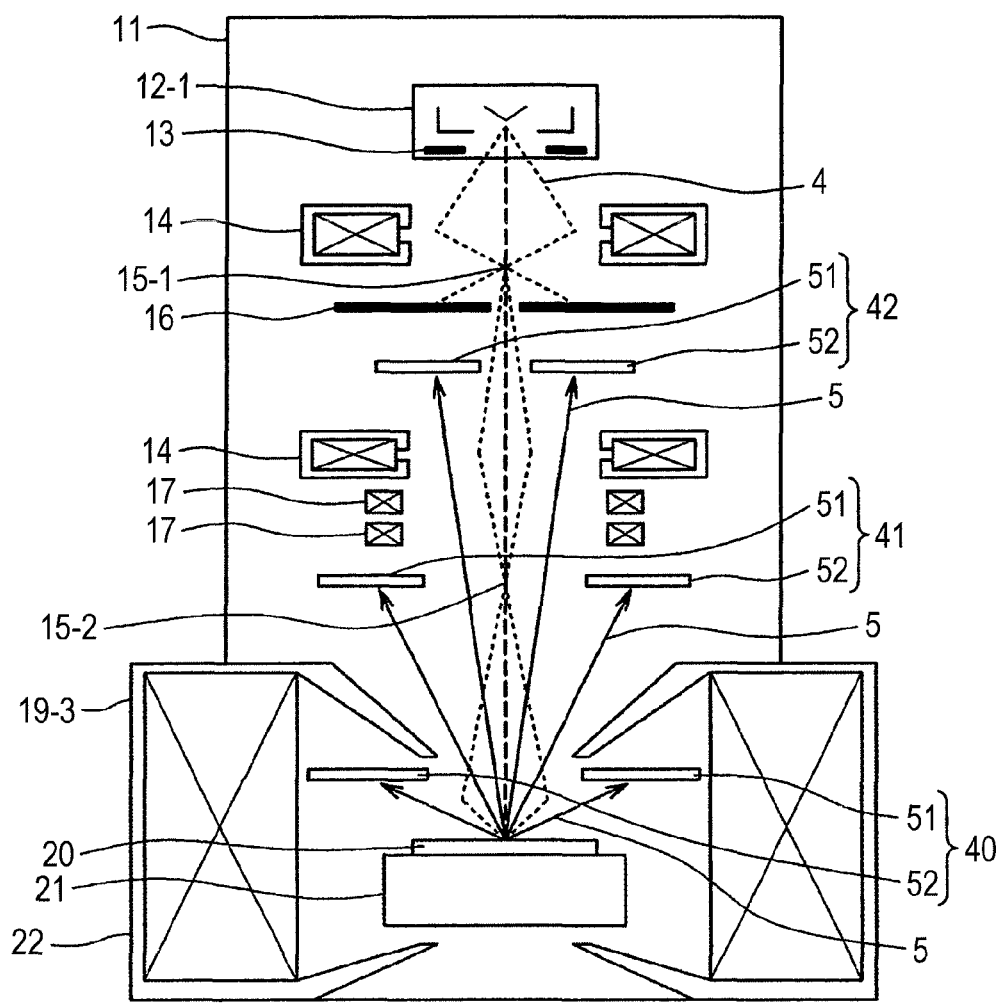
FIG. 14 is a schematic cross-section view of a scanning electron microscope according to a third embodiment.

FIG. 14 is a drawing showing the entire configuration of a scanning electron microscope that can simultaneously detect electrons included in plural energy bands using separate small detectors included as components of the detector of the scanning electron microscope.

The scanning electron microscope shown in FIG. 14 is different from the second embodiment in that an object lens of this scanning electron microscope is different from that of the second embodiment. The object lens of this embodiment is an in-lens type objective Lens 19-3. The configuration of the detector 2 of this embodiment is fundamentally similar to that of the second embodiment. However, in this embodiment, the objective lens is an in-lens type objective Lens and a specimen 20 is disposed in the objective lens 19-3, therefore a detector L 40 disposed between the specimen 20 and the objective lens 19-3 has a limitation that the detector L 40 must be accommodated in the objective lens 19-3.

The detection methods, particularly the method of discrimination detection of angles and energies is the same for both first embodiment and second embodiment.

As described above, this embodiment includes three detectors, that is, the detector L 40, the detector M 41, and the detector U 42, but a configuration that is lacking in any one of the above three detectors will do.

In this embodiment, the objective lens is an in-lens type objective Lens 19-3, and the specimen 20 is disposed in a magnetic field generated in the objective lens. Therefore, this embodiment can perform an observation of the specimen 20 with a higher resolution than the second embodiment that employs the semi-in-lens type objective lens can do.

According to this embodiment, as with the case of the first embodiment, a charged particle beam apparatus that can detect charged particle signals through discriminating the charged particle signals into plural energy bands, and obtain high-resolution images for each of the energy bands using the signals can be provided. In addition, because this embodiment includes the detectors L, M, and U as with the second embodiment, this embodiment can detect charged particles emitted with a wider range than the first embodiment can do. In addition, by employing an in-lens type objective Lens as an objective lens, this embodiment can perform an observation of the specimen 20 with a higher resolution than the second embodiment can do.

Fourth Embodiment

A fourth embodiment will be described with reference to FIG. 15. Hereinafter, it will be assumed that items, which have been described in the first embodiment, but will not be described in this embodiment, have the same properties as described in the first embodiment.

Figure 15:
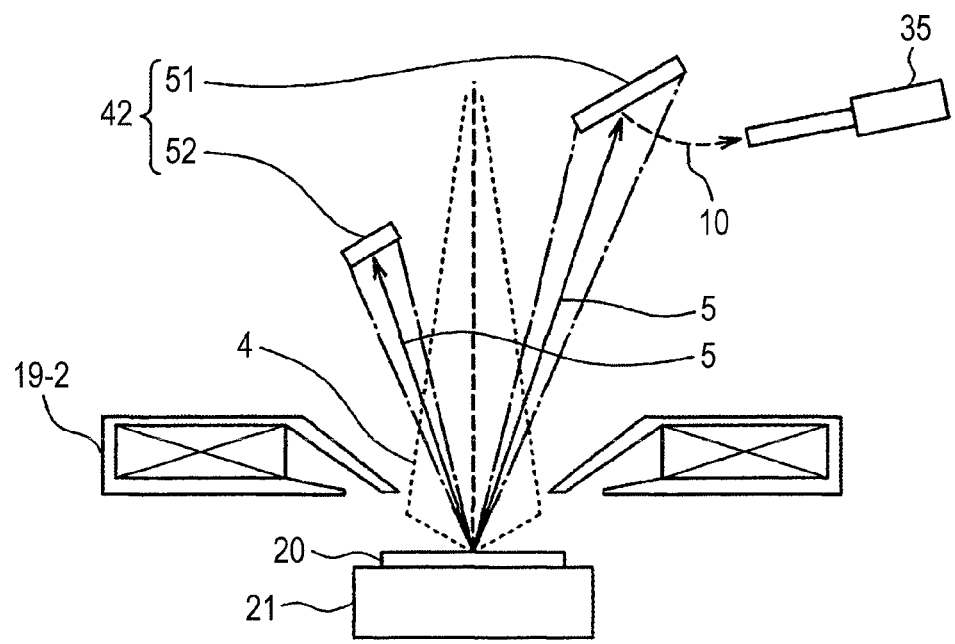
FIG. 15 is a cross-section view of substantial parts of a scanning electron microscope according to a fourth embodiment.

FIG. 15 is a drawing showing the partial configuration of a scanning electron microscope that can simultaneously detect electrons included in plural energy bands using separate small detectors included as components of the detector of the scanning electron microscope.

Roughly speaking, the fundamental configuration of the scanning electron microscope is similar to that of the scanning electron microscope of the second embodiment, and FIG. 15 shows a specimen 20; a specimen holder 21 for holding the specimen 20; an objective lens 19-2; and a detector U 42. Although the objective lens of this embodiment is a semi-in-lens type objective lens as with the objective lens of the second embodiment, an out-lens type objective lens or an in-lens type objective Lens can also be used.

In the detector U 42, small detectors (corresponding to the small detectors included in the detector 2 in FIG. 2) are disposed in the same plane, but they are disposed at a slant to the optical axis. The detector U 42 includes the detector 2 that is a collection of plural small detectors having different energy sensitivities, and a detector 35 for low energy electrons installed at the detector plane side of the detector 2 so that the detector 35 for low energy electrons does not prevent signal electrons 5 from being detected. This detector 35 for low energy electrons detects ultra low energy electrons generated when the signal electrons emitted from the specimen 20 crash against the thin film formed on the detecting surface of the small detectors with a thin film included in the detector 2.

The small detectors disposed on the same plane in the detector 2 are set so that the solid angles of the small detectors are the same even if the detecting surfaces of the small detectors are at a slant to the optical axis. In this case, two detection detector planes being on the same plane means that the distance between the two detection detector planes is within 1 mm or within 5 mm, and two detection solid angles being the same means that, when comparing the two solid angles, the difference between the areas of the detection detector planes corresponding to the two detection solid angles is within 5% or within 10%.

The detection mechanism of the detector 2 of this embodiment is similar to those of the detector of the first embodiment, the second embodiment, and the third embodiment. Signal electrons 5 that have small zenith angles and are emitted in the direction near to the normal line of the surface of the specimen 20 are targets for detection by the detectors U 42.

The discrimination detection regarding the azimuth angle depends on the shape and the divided patterns of the detector plane of the detector, and the discrimination detection regarding energy depends on the installation method of the thin film 1 installed on the detector plane of the small detector 51 with a thin film, and as long as corresponding small detectors have the same detection solid angles, the shape and the divided patterns of the detector plane of the detector U 42 can be freely changed.

In this embodiment, ultra low energy electrons 10, which are generated when low-energy electrons among signal electrons emitted from the specimen hits the thin films installed on the detecting surfaces of the small detectors included in the detector 2, are mainly detected. In FIG. 15, although the detector 2 is disposed at a slant in order to increase the signal yield, the detector 2 can be disposed perpendicular to the optical axis as with the first embodiment to the third embodiment. In this case, a detector being perpendicular to the optical axis means that the angle between the detection detector plane of the detector and the optical axis is within 90°−10° to 90°+10°.

Here, the above configuration that includes such a detector 2 can be applied in a similar way to any of the first embodiment to the third embodiment that have already been described so far.

According to this embodiment, as with the case of the first embodiment, a charged particle beam apparatus that can detect charged particle signals through discriminating the charged particle signals into plural energy bands, and obtain high-resolution images for each of the energy bands using the signals can be provided.

Fifth Embodiment

A fifth embodiment will be described with reference to FIG. 16 and FIG. 17. Hereinafter, it will be assumed that items, which have been described in the first embodiment, but will not be described in this embodiment, have the same properties as described in the first embodiment.

Figure 16:
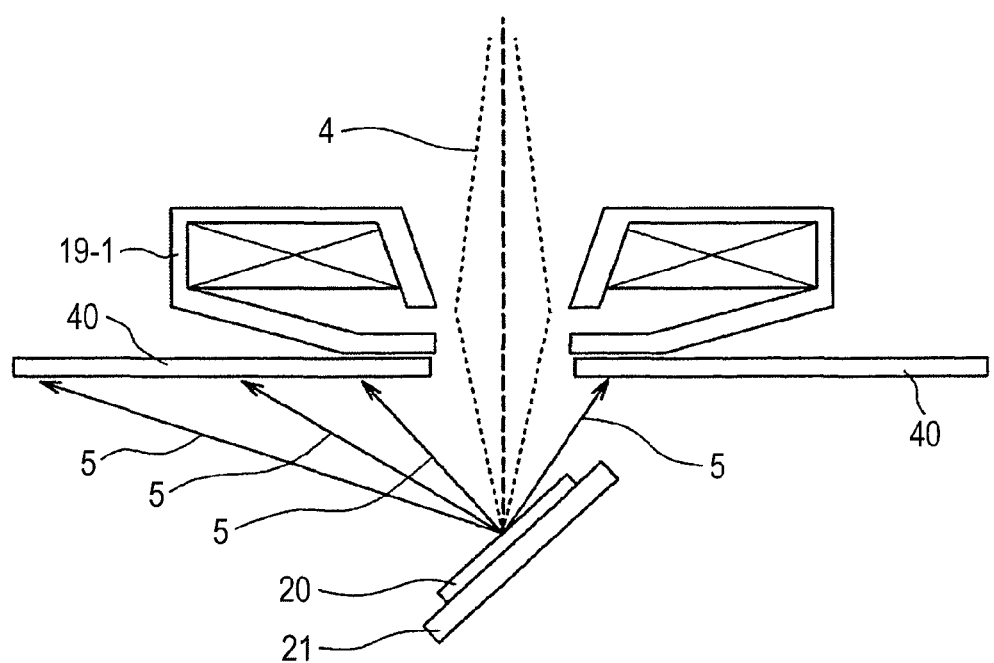
FIG. 16 is a cross-section view of substantial parts of a scanning electron microscope according to a fifth embodiment.

FIG. 16 is a drawing showing the partial configuration of a scanning electron microscope that can simultaneously detect electrons included in plural energy bands using separate small detectors included as components of a detector of the scanning electron microscope.

Roughly speaking, the fundamental configuration of the scanning electron microscope is similar to that of the scanning electron microscope of the first embodiment, and FIG. 16 shows a specimen 20; a specimen holder 21 for holding the specimen 20; an objective lens 19-1; and a detector L 40. It will be assumed that the potential of the specimen is the earth potential. Although the objective lens of this embodiment is an out-lens type objective lens as with the objective lens of the first embodiment, a semi-in-lens type objective lens or an in-lens type objective Lens can also be used.

In this embodiment, the surface of the specimen is disposed at a slant to the optical axis, and the detector L 40 is disposed perpendicular to the optical axis. In this case, a detector being perpendicular to the optical axis means that the angle between the detector plane of the detector and the optical axis is within 90°−10° to 90°+10°.

Here, the zenith angle of an electron emitted from the specimen 20 is defined in the same style as defined in the first embodiment. To put it concretely, it will be defined that the angle of a direction that is normal to the surface of the specimen is 0° while making the surface of the specimen as a reference plane. In this embodiment, signal electrons 5 emitted with their zenith angles 0° to 90° to the surface of the specimen 20 are targeted for detection.

The detection mechanism of this embodiment is similar to those of the first embodiment, the second embodiment, and the third embodiment. Therefore, the discrimination detection regarding the azimuth angle can be freely changed by the shape and the divided patterns of the detector plane of the detector, and the discrimination detection regarding energy can be freely changed by the installation method of the thin films installed on the detector planes of the small detectors with a thin film as long as corresponding small detectors have the same detection solid angles.

Here, the detection system as above can be applied in a similar way to any of the first embodiment to the fourth embodiment.

As described above, backscattered electrons emitted with a zenith angle 0° or 90° can be detected by slanting the specimen with respect to the detector, while these electrons cannot be detected otherwise. By selectively detecting backscattered electrons having zenith angles about 0°, and by performing high pass detection only on high-energy components with the use of thin films 1, component information can be obtained. In addition, by selectively detecting only backscattered electron components that have zenith angles about 90° and are emitted to an specific direction, and by performing high pass detection only on high-energy components with the use of thin films 1, contrasts emphasizing information on microscopic asperity of the surface can be obtained.

Figure 17:
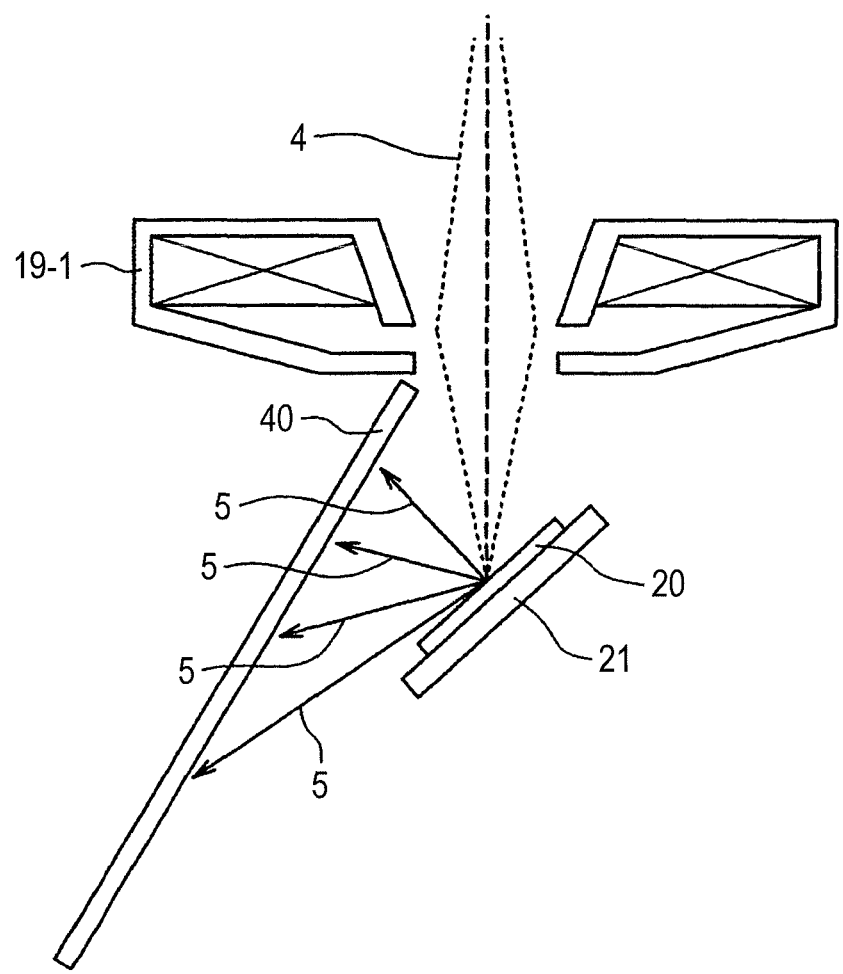
FIG. 17 is a cross-section view of substantial parts of another scanning electron microscope according to the fifth embodiment.

Although the configuration of this embodiment including the detector L 40 disposed perpendicular to the optical axis has been described so far, a detector L 40 disposed at a slant with respect to the optical axis as shown in FIG. 17 can be also used instead of the detector L 40 disposed perpendicular to the optical axis.

According to this embodiment, as with the case of the first embodiment, a charged particle beam apparatus that can detect charged particle signals through discriminating the charged particle signals into plural energy bands, and obtain high-resolution images for each of the energy bands using the signals can be provided. In addition, backscattered electrons emitted with a zenith angle 0° or 90° can be detected by slanting the specimen.

Sixth Embodiment

A sixth embodiment will be described with reference to FIG. 18. Hereinafter, it will be assumed that items, which have been described in the first embodiment, but will not be described in this embodiment, have the same properties as described in the first embodiment.

Figure 18:
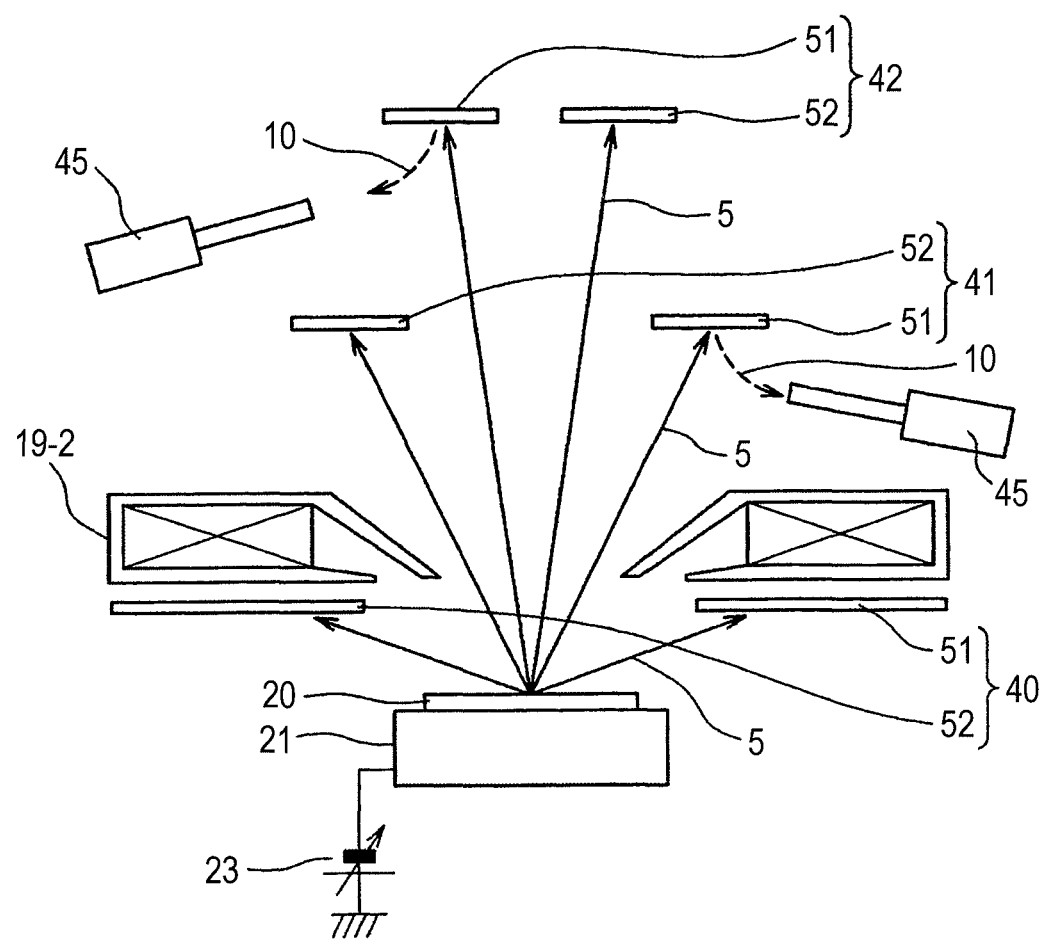
FIG. 18 is a cross-section view of substantial parts of a scanning electron microscope according to a sixth embodiment.

FIG. 18 is a drawing showing the partial configuration of a scanning electron microscope that can simultaneously detect electrons included in plural energy bands using separate small detectors included as components of a detector of the scanning electron microscope.

Roughly speaking, the fundamental configuration of the scanning electron microscope is similar to that of the scanning electron microscope of the second embodiment, and FIG. 18 shows a specimen 20; a specimen holder 21 for holding the specimen 20; an objective lens 19-2; and a detector L 40, a detector M 41, and a detector U 42. Although the objective lens of this embodiment is a semi-in-lens type objective lens as with the objective lens of the second embodiment, an out-lens type objective lens or an in-lens type objective Lens can also be used.

The configuration of a detector used in this embodiment is similar to that of the detector used in the fourth embodiment, and each of a detector L 40, a detector M 41, and a detector U 42 is equivalent to the detector 2 shown in FIG. 1, and is disposed perpendicular to the optical axis. In this case, a detector being perpendicular to the optical axis means that the angle between the detection detector plane of the detector and the optical axis is within 90°−10° to 90°+10°. The role of a detector 45 for low energy electrons is similar to that of the detector 35 for low energy electrons in the fourth embodiment, and the detector 45 for low energy electrons is a detector for detecting ultra low energy electrons 10 generated when signal electrons emitted from the specimen 20 crash against the thin film formed on the detecting surface of the small detectors with a thin film included in the detectors 2 (41, 42).

Although the descriptions about the first embodiment to fifth embodiment have been made under the assumption that the potential of the specimen is the earth potential, a negative voltage (bias voltage applied to the specimen) 23 is applied to the specimen in this embodiment. The magnitude of the negative voltage applied to the specimen depends on the magnitude of withstand voltage of the scanning electron microscope, and typically it ranges from minus 1.0 kV to minus 2.5 kV. Because the aberration can be reduced by applying the negative voltage to the specimen, applying the negative voltage to the specimen is more advantageous in terms of resolution especially when the observation is performed using a low acceleration voltage.

The zenith angle of an electron emitted from the specimen 20 is defined in the same style as defined in the first embodiment. In this embodiment, in the case where the surface of the specimen 20 is disposed in parallel with the horizontal plane, signal electrons 5 emitted with their zenith angles 0° to 90° are targeted for detection. In this case, backscattered electrons targeted for detection by the detector L 40 are backscattered electrons (BSE) 7 emitted with large zenith angles, that is, with zenith angles nearly along the surface of specimen 20. On the other hand, signal electrons targeted for detection by the detector U 42 are signal electrons 5 emitted with small zenith angles, that is, with zenith angles nearly along the normal line of the surface of the specimen 20. Signal electrons targeted for detection by the detector M 41 are signal electrons 5 emitted with zenith angles included in a detection solid angle between the detector U 42 and the detector L 40.

The detection mechanism of this embodiment is similar to those of the first embodiment, the second embodiment, and the third embodiment. Therefore, the discrimination detection regarding the azimuth angle can be freely changed by the shape and the divided patterns of the detector plane of the detector, and the discrimination detection regarding energy can be freely changed by the installation method of the thin films installed on the detector planes of the small detectors 51 with a thin film as long as corresponding small detectors have the same detection solid angles.

As described above, this embodiment includes three detectors, that is, the detector L 40, the detector M 41, and the detector U 42, but a configuration that is lacking in any one of the above three detectors will do.

In the case where the potential of the specimen is set to the ground, the ultra low energy electrons cannot be detected in principle by the small detectors 52 without a thin film included in the detector 2. In this embodiment, however, the ultra low energy electrons are also accelerated by the negative voltage applied to the specimen 20. At this time, the ultra low energy electrons 6 are also detected by the small detectors 52 without a thin film. Even in such a case as this, by adjusting the energy sensitivities of the small detector 51 with a thin film, the ultra low energy electrons, the low-energy electrons, and the high-energy electrons can be detected through discriminating those electrons.

For example, in the case where a negative voltage applied to the specimen is minus 1.5 kV, the acceleration voltage is set to be 3.0 kV, and Al thin films 1 of film thickness 30 nm are formed on the detector planes of solid state detectors having the lower limit threshold of energy sensitivity 2 keV, it is possible to make small detectors with a thin film have an energy sensitivity 1.8 kV or more. Therefore, typically, ultra low energy electrons with an energy 1.53 keV, and low-energy electrons with an energy 2.0 keV are not detected, and high-energy electrons with an energy 2.5 keV are detected. In this way, the detector according to this embodiment can be made to detect high-energy electrons, but not to detect ultra low energy electrons and low-energy electrons.

According to this embodiment, as with the case of the first embodiment, a charged particle beam apparatus that can detect charged particle signals through discriminating the charged particle signals into plural energy bands, and obtain high-resolution images for each of the energy bands using the signals can be provided. In addition, the aberration can be reduced by applying the negative voltage to the specimen.

Seventh Embodiment

A seventh embodiment will be described with reference to FIG. 19 and FIG. 20. Hereinafter, it will be assumed that items, which have been described in the first embodiment, but will not be described in this embodiment, have the same properties as described in the first embodiment.

Figure 19:
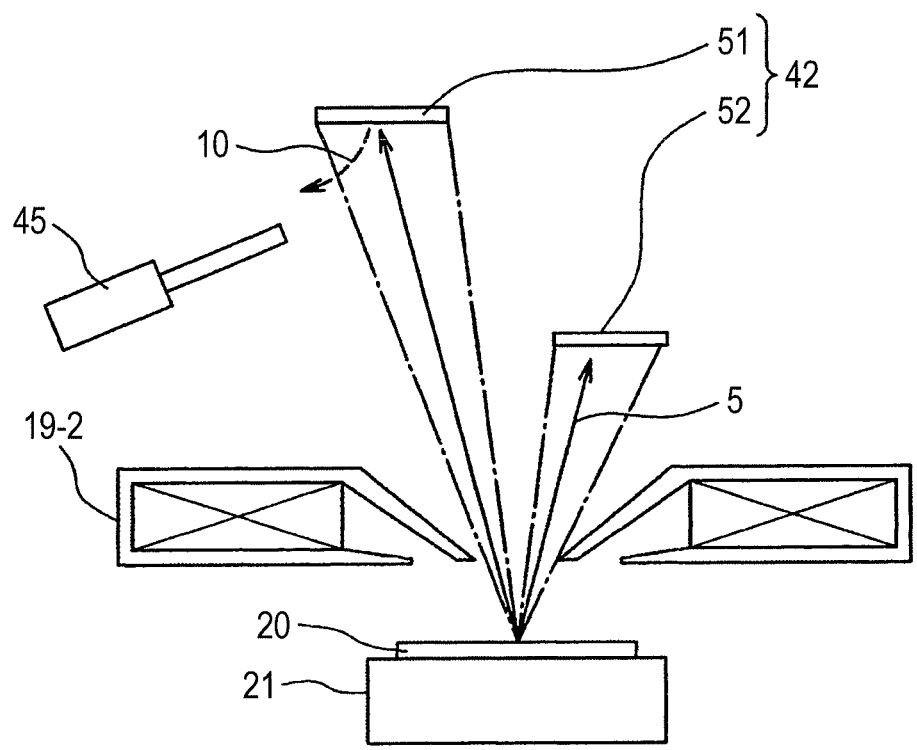
FIG. 19 is a cross-section view of substantial parts of a scanning electron microscope according to a seventh embodiment.

FIG. 19 is a drawing showing the partial configuration of a scanning electron microscope that can simultaneously detect electrons included in plural energy bands using separate small detectors included as components of a detector of the scanning electron microscope.

Roughly speaking, the fundamental configuration of the scanning electron microscope is similar to that of the scanning electron microscope of the second embodiment, and FIG. 19 shows a specimen 20; a specimen holder 21 for holding the specimen 20; an objective lens 19-2; and a detector U 42. Although the objective lens of this embodiment is a semi-in-lens type objective lens as with the objective lens of the second embodiment, an out-lens type objective lens or an in-lens type objective Lens can also be used. Either the case where the ground is applied to the specimen or the case where a negative potential is applied to the specimen will do.

In this embodiment, it will be assumed that the detector U 42 includes two small detectors, that is, a small detector with a thin film and a small detector without a thin film.

As shown in FIG. 19, the detector planes of the small detector 51 with a thin film and the small detector 52 without a thin film each are disposed perpendicular to the optical axis. In this case, the detector plane of a detector being perpendicular to the optical axis means that the angle between the detector plane of the detector and the optical axis is within 90°−10° to 90°+10°. In this case, the detector planes of the two small detectors are set to be nearly in parallel with each other.

Figure 20:
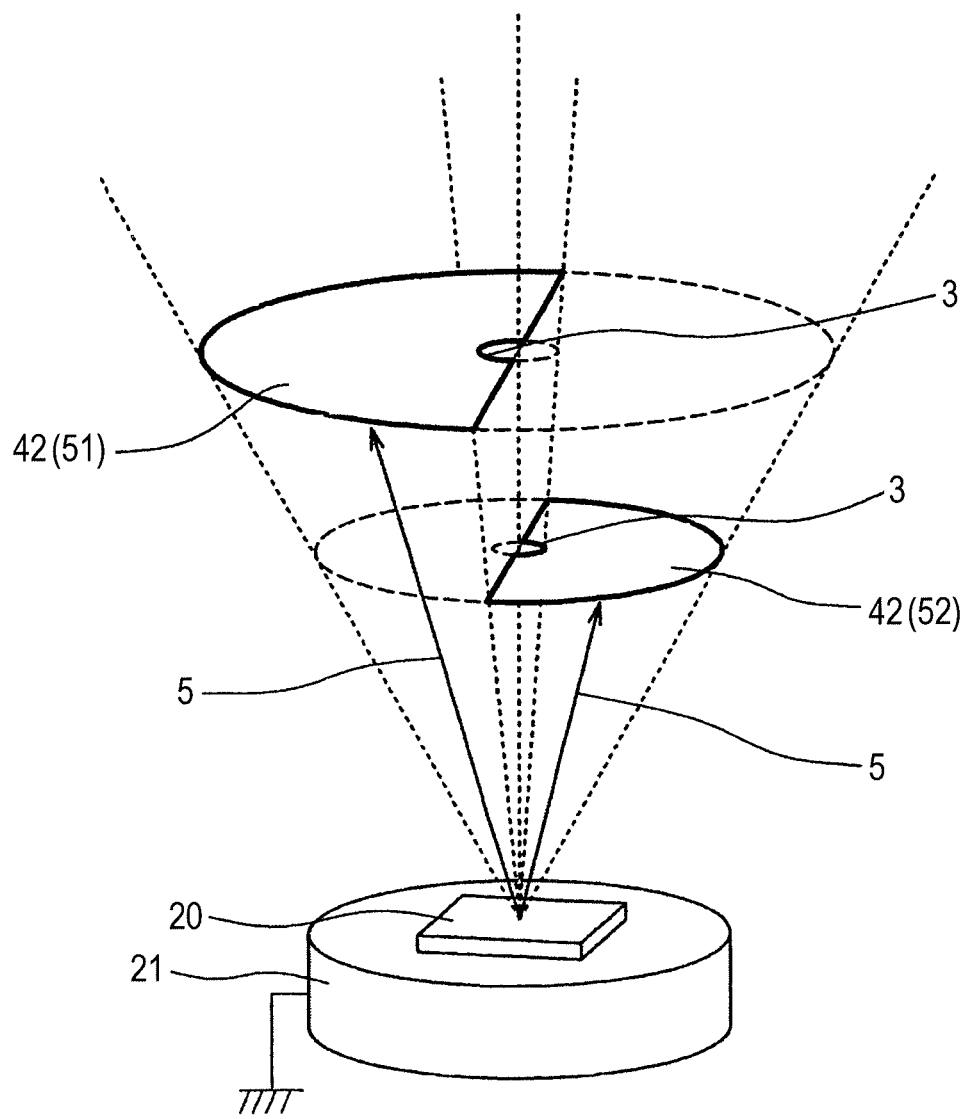
FIG. 20 is a perspective view showing a positional relationship between electron detectors shown in FIG. 19.

FIG. 20 is a diagram showing the small detector 51 with a thin film, the small detector 52 without a thin film, the specimen 20, and the specimen holder 21 in FIG. 19 viewed from an upper oblique direction. As shown in FIG. 20, the detection solid angle of the small detector 51 with a thin film, and the detection solid angle of the small detector 52 without a thin film are set to be the same. In this case, two detection solid angles being the same means that, when comparing the two solid angles each of which is determined by a specimen and the area of a detection detector plane corresponding to each of the solid angles, the difference between the areas corresponding to the two detection solid angles is within 5% or within 10%.

Because the two detection solid angles are the same, signal electrons actually detected are equivalent to those detected by the detector U in the first embodiment to the third embodiment. The above description has been made about the configuration in which the detector U 42 includes the small detector with a thin film and the small detector without a thin film both of which have different energy sensitivities, but actually such a configuration is not indispensable for this embodiment.

Because this embodiment is realized under the condition that there is at least one pair of small detectors both of which have the same solid angles, do not reside on the same plane, and have different energy sensitivities, the detector is not mounted on a single plane and has a configuration in which the segmented small detectors are disposed on plural planes.

Owing to the above configuration of the detector, this embodiment can have an improved flexibility in the case of disposing plural detectors. A detector 45 for low energy electrons shown in FIG. 19 is a detector for detecting ultra low energy electrons 10 emitted from the specimen. If the small detector with a thin film and the small detector 52 without a thin film are disposed on the same plane, the small detector with a thin film becomes a solid obstacle, but because the positions of the detectors can be changed while keeping the detection solid angles equal, it is possible to prevent the small detector with a thin film from becoming the solid obstacle.

Although the above description has been made under the assumption that both small detectors of a pair of small detectors are disposed perpendicular to the optical axis in this embodiment, the present invention does not place a limit that both small detectors of the pair of small detectors are disposed perpendicular to the optical axis as long as both small detectors provide the same solid angles and do not reside on the same plane.

According to this embodiment, as with the case of the first embodiment, a charged particle beam apparatus that can detect charged particle signals through discriminating the charged particle signals into plural energy bands, and obtain high-resolution images for each of the energy bands using the signals can be provided. In addition, because the small detectors 51 and 52 can be devices independent of each other, this embodiment can have an improved flexibility in the case of disposing plural detectors.

Eighth Embodiment

A eighth embodiment will be described with reference to FIG. 21. Hereinafter, it will be assumed that items, which have been described in the first embodiment, but will not be described in this embodiment, have the same properties as described in the first embodiment.

Figure 21:
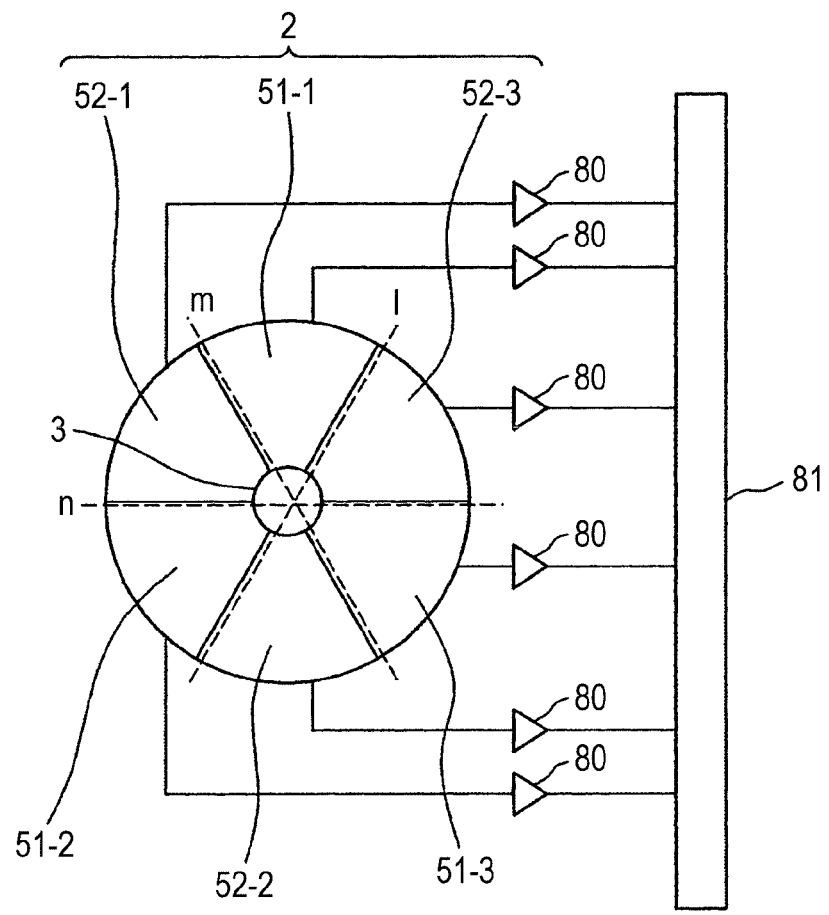
FIG. 21 is a cross-section view of substantial parts of a scanning electron microscope according to an eighth embodiment.

FIG. 21 is a drawing showing the entire configuration of a detector capable of simultaneously detecting electrons belonging to plural energy bands with the use of separate small detectors that are components of the detector and another detector that has a calculation system for calculating output signals from the former detector and can simultaneously output high pass signals, low pass signals, and band pass signals.

The following description will be made under the assumption that the detector is disposed on the optical axis, and that a detector 2 has a passage hole 3 for primary electrons at its center, and includes two types of small detectors that have different energy sensitivities, that is, small detectors with a thin film 51 (51-1, 51-2, 51-3), and small detectors without a thin film 52 (52-1, 52-2, 52-3). FIG. 21 is a diagram showing that the detector plane of the detector is disposed on the same plane and is radially and equally divided into six. Here, it will be assumed that the thin films installed on the detector planes of the small detectors with a thin film is of the same material and of the same film thickness. In this case, the thin films being of the same material means that the thin films are produced under the same conditions, and the thin films being of the same film thickness means that the film thickness in-plane distribution across all the small detectors with a thin film ranges from minus 10% to plus 10%.

In this embodiment, the description will be made about the detector 2 whose detector plane is divided by radial lines but not divided by concentric lines for the sake of simplicity.

For convenience of explanation, the six small detectors are respectively given reference signs. To put it concretely, a small detector A 51-1 with a thin film, a small detector A 52-1 without a thin film, a small detector B 51-2 with a thin film, a small detector B 52-2 without a thin film, a small detector C 51-3 with a thin film, and a small detector C 52-3 without a thin film are disposed counterclockwise in this order in the detector 2 in FIG. 21. In addition, three axes of symmetry l, m, and n are set up for convenience of explanation as shown in FIG. 21.

Output signals from the six small detectors are respectively sent to separate amplifiers 80, and output results from these amplifiers are sent to a signal calculation system 81. Signals obtained as calculation results are displayed on a display terminal (not shown). The contents of calculation performed by the signal calculation system 81 are multiplying each of the output signals from the amplifiers by a constant number, and adding or subtracting any two signals. In addition, unless there are particular reasons to the contrary, the above amplifiers are of the same type, the same values are given to the gains of the amplifiers, and the same values are given to the offsets (zero points) of the amplifiers. In addition, this embodiment is configured so that each of the small detectors has its own amplifier 80.

In this embodiment, it will be assumed for simplicity that signal electrons 5 are uniformly emitted in the azimuth direction from the specimen.

The detector shown in this embodiment is a detector that obtains the low pass signals or the band pass signals through calculation in which the signal calculation system 81 calculates differential signals using output signals of the small detectors having the same detection solid angles. In such a case as this embodiment where small detectors having highly-symmetric detector planes are disposed, it is conceivable that there are plural combinations of the small detectors. In this case, two detection solid angles being the same means that, when comparing the two solid angles each of which is determined by a specimen and the area of a detection detector plane corresponding to each of the solid angles, the difference between the areas corresponding to the two detection solid angles is within 5% or within 10%.

First, a method for obtaining low pass signals through calculation in which differential signals are calculated regarding a pair of small detectors having the same solid angles will be described below.

A method for obtaining differential signals regarding small detectors that are disposed symmetrically about the axis of symmetry l will be described below. In this case, the small detector A 51-1 with a thin film corresponds to the small detector C 52-3 without a thin film, the small detector A 52-1 without a thin film corresponds to the small detector C 51-3 with a thin film, and the small detector B 51-2 with a thin film corresponds to the small detector B 52-2 without a thin film.

For one of the above combinations, by subtracting the output signals of the small detector with a thin film multiplied by a proper constant number from the output signals of the small detector without a thin film, detected signals derived from electron signals that are shuttered by the thin film can be obtained. Here, the above proper constant number used for the multiplication is determined by an acceleration voltage and the film thickness of the thin film. The signal calculation system 81 performs the above calculation and outputs resultant signals.

In other words, by obtaining and using signals output from the above combinations, detected signals on which low pass energy discrimination and azimuth angle discrimination have been performed can be obtained. In addition, output signals from the small detector with a thin film of each of the above combinations are high pass energy discrimination signals, and therefore a low pass detection image and a high pass detection image for the same solid angles can be obtained at the same time.

Hereinafter, output signals from small detectors whose solid angles correspond to each other will be calculated in the case of the axes of symmetry m or n as is the case of the axis of symmetry l.

A method for obtaining differential signals regarding small detectors that are disposed symmetrically about the axis of symmetry m will be described below. In this case, the small detector A 52-1 without a thin film corresponds to the small detector A 51-1 with a thin film, the small detector B 51-2 with a thin film corresponds to the small detector C 52-3 with a thin film, and the small detector B 52-2 without a thin film corresponds to the small detector C 51-3 with a thin film. The signal calculation system 81 calculates differential signals corresponding to each of the above pairs as is the case with the axis of symmetry l, and the calculation result is output.

A method for obtaining differential signals regarding small detectors that are disposed symmetrically about the axis of symmetry n will be described below. In this case, the small detector B 51-2 with a thin film corresponds to the small detector A 52-1 without a thin film, the small detector B 52-2 without a thin film corresponds to the small detector A 51-1 with a thin film, and the small detector C 51-3 with a thin film corresponds to the small detector C 52-3 without a thin film. The signal calculation system 81A calculates differential signals corresponding to each of the above pairs as is the case with the axis of symmetry l, and the calculation result is output.

In the case of obtaining differential signals regarding small detectors that are disposed symmetrically about the center point of a passage hole 3 of the center portion of the detector, the small detector A 51-1 with a thin film corresponds to the small detector B 52-2 without a thin film, the small detector A 52-1 without a thin film corresponds to the small detector C 51-3 with a thin film, and the small detector B 51-2 with a thin film corresponds to the small detector C 52-3 without a thin film. The signal calculation system 81 calculates differential signals corresponding to each of the above pairs as is the case with the axis of symmetry l, and the calculation result is output.

In the case where differential signals between output signals from a pair of small detectors are calculated, if the signal yield is insufficient, output signals obtained from other plural pairs of small detectors can be added to the former output signals. In other words, among the above pairs of small detectors whose solid angles are equivalent, two or more pairs can be selected as long as the two or more pairs share one small detector. Afterward, all detected signals obtained from the small detectors with a thin film of the two or more selected pairs are added, and all detected signals obtained from the small detectors without a thin film of the two or more selected pairs are also added. Next, as is the case where a pair of a small detector with a thin film and a small detector without a thin film is used in the detection, by subtracting the sum of all the output signals, which are obtained from the small detectors with a thin film, multiplied by a proper constant number from the sum of all the detected signals which are obtained from the small detectors without a thin film, detected signals derived from electron signals that are shuttered by the thin films can be obtained.

For example, assuming that there are three pairs of a small detector with a thin film and a small detector without thin film, the case where signal calculation is performed regarding these three pairs will be described hereinafter. To put it concretely, signals obtained from the small detector A 51-1 with a thin film, the small detector C 51-3 with a thin film, and the small detector B 51-2 with a thin film are all added, and output signals obtained from the small detector C 52-3 without a thin film, the small detector A 52-1 without a thin film, and the small detector B 52-2 without a thin film are all added. Next, by subtracting the sum of all the output signals, which are obtained from the small detectors 51 with a thin film, multiplied by a proper constant number from the sum of all the detected signals which are obtained from the small detectors 52 without a thin film, detected signals derived from electron signals that are shuttered by the thin films can be obtained. As described above, if the detecting surface is divided into an even number in the azimuth direction, and small detectors 51 with a thin film and small detectors 52 without a thin film are alternately disposed one-by-one, and the energy sensitivities of all the small detectors with a thin film are the same, there is an advantage in that, even if the distribution of emitted electrons is not even in the azimuth direction, an influence of the shade and shadow on the detection image can be suppressed by subtracting the sum of all the output signals, which are obtained from the small detectors 51 with a thin film, multiplied by a proper constant number from the sum of all the detected signals which are obtained from the small detectors 52 without a thin film. However, if such a calculation as above is performed, angle discrimination detection regarding the azimuth direction cannot be performed.

Although the above description has been made by taking a group of the small detectors, which are obtained by dividing equally a circular detecting surface into six, and hence each of which has a shape of a fan with a center angle 60°, as an example, a detector that is further concentrically divided in order for an angle discrimination detection regarding the elevation direction to be performed, or a detector that is further minutely radially divided in order for a discrimination detection regarding the azimuth direction to be minutely performed can be also taken as an example.

In addition, a configuration including such a detector 2 as described above can be also applied to any of the above-described first to sixth embodiments. However, if electrons are detected by a detector including such a signal calculation system as described above, for two small detectors that have the same solid angles, it is required that the yields of electrons that reach the detector planes of the two small detectors are almost the same, and therefore it is prerequisite that there is no asymmetric field about the optical axis.

With the use of a detector including the signal calculation system according to this embodiment, low pass signals or band pass signals as well as high pass signals can be obtained.

According to this embodiment, a charged particle beam apparatus that can detect charged particle signals through discriminating the charged particle signals into plural energy bands, and obtain high-resolution images for each of the energy bands using the signals can be provided.

Ninth Embodiment

A ninth embodiment will be described with reference to FIG. 22. Hereinafter, it will be assumed that items, which have been described in the first embodiment, but will not be described in this embodiment, have the same properties as described in the first embodiment.

Figure 22:
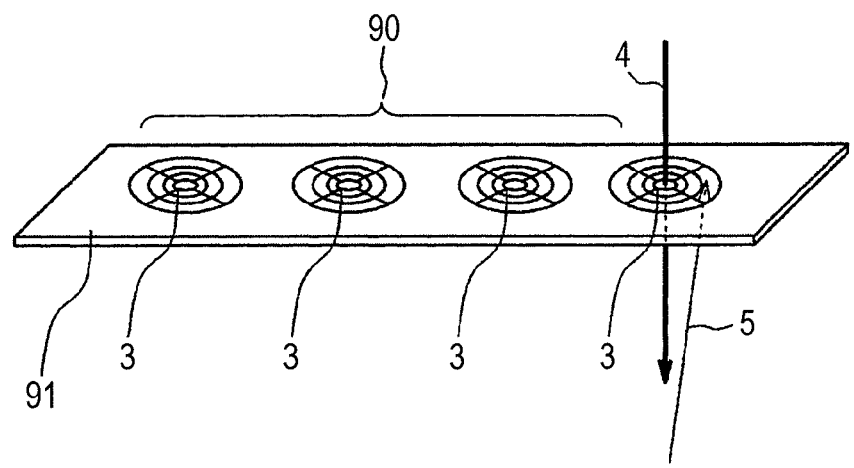
FIG. 22 is a cross-section view of substantial parts of a scanning electron microscope according to a ninth embodiment.

FIG. 22 shows a detected energy band variable mechanism of a detector used in a scanning electron microscope according to this embodiment.

Plural small detectors that have different energy sensitivities, that is, small detectors 90 including small detectors without a thin film, and small detectors having thin films of various film thicknesses or thin films of various materials, are fixed on a rectangular plate-like detector holder 91. The lower surface of the detector holder 91 is disposed perpendicular to a primary electron beam 4. This detected energy band variable mechanism is configured so that any small detector can be fixed in a position where the primary electron beam 4 passes through the central hole 3 of the small detector using a linear manipulator that can retractably move each detector.

With the use of the detected energy band variable mechanism configured as above, energy sensitivity thresholds for low energy electrons and high energy electrons included in signal electrons 5 can be respectively set to be desired values.

FIG. 22 shows that the detector plane of the detector is divided as shown in FIG. 2, but any of the detectors shown in FIG. 2 to FIG. 8 or any detector that have detector plane pursuant to that of any of the detectors shown in FIG. 2 to FIG. 8 can be used.

In addition, the method of using another detector instead of the detector 2 as above can be applied to any of the first embodiment to the seventh embodiment.

According to this embodiment, a charged particle beam apparatus that can detect charged particle signals through discriminating the charged particle signals into plural energy bands, and obtain high-resolution images for each of the energy bands using the signals can be provided. In addition, with the use of the detector holder that holds plural detectors having various energy sensitivities, an energy sensitivity threshold can be set to be a desired value.

Tenth Embodiment

A tenth embodiment will be described with reference to FIG. 23. Hereinafter, it will be assumed that items, which have been described in the first embodiment, but will not be described in this embodiment, have the same properties as described in the first embodiment.

Figure 23:
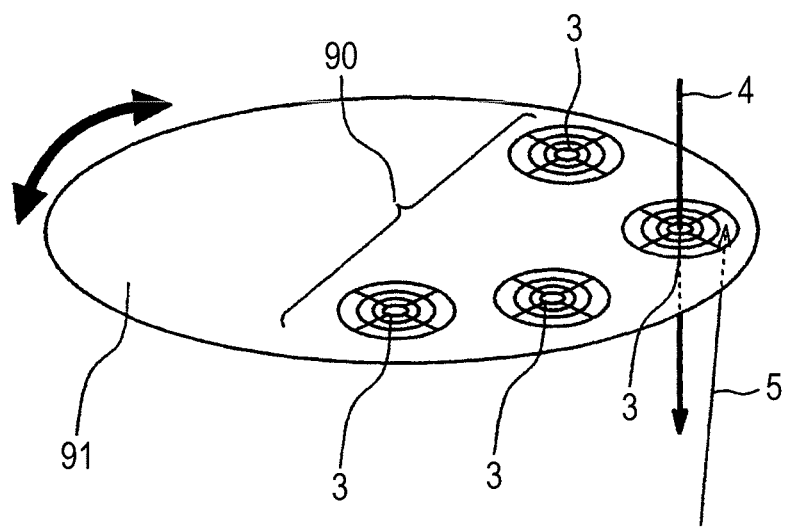
FIG. 23 is a cross-section view of substantial parts of a scanning electron microscope according to a tenth embodiment.

FIG. 23 is a component of a tenth embodiment of the present invention, and shows a detected energy band variable mechanism of a scanning electron microscope according to the present invention.

Plural small detectors that have different energy sensitivities, that is, small detectors 90 including small detectors without a thin film, and small detectors having thin films of various film thicknesses or thin films of various materials, are fixed on a disk-shaped or fan-shaped detector holder 91. The lower surface of the detector holder 91 is disposed perpendicular to a primary electron beam 4. This detected energy band variable mechanism is configured so that any small detector can be fixed in a position where the primary electron beam 4 passes through the central hole 3 of the small detector by revolving the disk-shaped or fan-shaped detector holder 91.

With the use of the detected energy band variable mechanism configured as above, energy sensitivity thresholds for low energy electrons and high energy electrons included in signal electrons 5 can be respectively set to be desired values.

FIG. 23 shows that the detector planes of the small detectors are divided as shown in FIG. 2, but any of the detectors shown in FIG. 2 to FIG. 8 or any of detectors that have detector planes pursuant to those of the detectors shown in FIG. 2 to FIG. 8 can be used as the small detector shown in FIG. 22.

In addition, the method of using another detector instead of the detector 2 as above can be applied to any of the first embodiment to the seventh embodiment.

According to this embodiment, a charged particle beam apparatus that can detect charged particle signals through discriminating the charged particle signals into plural energy bands, and obtain high-resolution images for each of the energy bands using the signals can be provided. In addition, with the use of the disk-shaped or fan-shaped detector holder that holds plural detectors having various energy sensitivities, an energy sensitivity threshold can be set to be a desired value.

LIST OF REFERENCE SIGNS

1: thin film,
2: electron detector,
3: central hole,
4: primary electron beam,
5: signal electron,
6: ultra low energy electron (up to several eV),
7: backscattered electron (BSE) (up to several keV),
8: low energy BSE,
9: high energy BSE,
10: ultra low energy electron generated when the BSE hits the thin film,
11: electron optics column,
12: electron gun,
13: acceleration electrode,
14: condenser lens,
14-1: first condenser lens,
14-2: second condenser lens,
15: crossover under the condenser lens,
15-1: crossover under first condenser lens,
15-2: crossover under second condenser lens,
16: aperture,
17: double scan deflector,
19: objective lens,
19-1: out-lens type objective lens,
19-2: semi-in-lens type objective lens,
19-3: in-lens type objective lens,
20: specimen,
21: specimen holder,
22: specimen chamber,
23: bias voltage applied to the specimen,
35: detector for low energy electrons,
40: detector 1,
41: detector m,
42: detector u,
51: small detector with a thin film,
51-1: small detector a with a thin film,
51-2: small detector b with a thin film,
51-3: small detector c with a thin film,
51-4: small detector d with a thin film,
51-5: small detector e with a thin film,
51-6: small detector f with a thin film,
52: small detector without a thin film,
52-1: small detector a without a thin film,
52-2: small detector b without a thin film,
52-3: small detector c without a thin film,
52-4: small detector d without a thin film,
52-5: small detector e without a thin film,
52-6: small detector f without a thin film,
601: material of thin film of small detector a,
602: material of thin film of small detector b,
701: film thickness of thin film of small detector a,
702: film thickness of thin film of small detector b,
80: amplifier,
81: signal processing system,
90: small detector with thin film whose thickness or material is/are different, or small detector without film,
91: detector holder

The invention claimed is:

1. A charged particle beam apparatus comprising:
 a charged particle source to generate a charged particle beam that works as a probe;
 an aperture to limit the diameter of the particle beam;
 an optics for the charged particle beam;
 a specimen holder on which a specimen, to which the charged particle beam is to be irradiated, is mounted;
 a charged particle detector to detect secondary charged particles and backscattered charged particles from a specimen; and
 a signal calculation unit to process an output signal from the charged particle detector, wherein
  the charged particle detector includes a first small detector having a first detection sensitivity and a second small detector having a second detection sensitivity higher than the first detection sensitivity, and
  the charged particle detector makes detection solid angles viewed from a position on the specimen, to which the charged particle beam is to be irradiated, for the first small detector and for the second small detector to be the same.

2. The charged particle beam apparatus according to claim 1, wherein the charged particle beam detector includes a detector plane on which a thin film is formed.

3. The charged particle beam apparatus according to claim 2, wherein the film thickness of the thin film is 10 nm or more and 100 μm or less.

4. The charged particle beam apparatus according to claim 2, wherein
 the charged particle beam apparatus further comprises a second charged particle detector other than the charged particle detector, and
 the second charged particle detector is disposed in such a position as to be able to detect a charged particle generated when a signal charged particle hits the thin film formed on the detector plane of the charged particle detector.

5. The charged particle beam apparatus according to claim 1, wherein the detection solid angles being the same means that the difference between the detection solid angles is within 10%.

6. The charged particle beam apparatus according to claim 1, wherein the detector plane of the first small detector and the detector plane of the second small detector are disposed on the same plane.

7. The charged particle beam apparatus according to claim 6, wherein the detector planes of the first small detector and the second small detector being disposed on the same plane means that the distance between the two detector planes is within 1 mm.

8. The charged particle beam apparatus according to claim 1, wherein the energy sensitivity of the charged particle beam detector is adjusted using the film thickness of the thin film, the material of the thin film, or both.

9. The charged particle beam apparatus according to claim 1, wherein the charged particle beam apparatus is a scanning electron microscope.

10. The charged particle beam apparatus according to claim 1, wherein the charged particle beam detector is a solid state detector, a detector using an avalanche diode, a detector using a micro channel plate, a detector using a scintillator as a component, or a combination of some of the above detectors.

11. The charged particle beam apparatus according to claim 1, wherein
 the charged particle detector includes a hole, through which a primary charged particle beam passes, at the center thereof;
 the hole is disposed axisymmetrically about the optical axis of the optics for the charged particle beam; and
 each of the detector plane shapes of the first and the second small detector is segmented and separated axisymmetrically about the optical axis.

12. The charged particle beam apparatus according to claim 1, wherein the first small detector and the second small detector are arranged in an array form.

13. The charged particle beam apparatus according to claim 1, wherein
 the first detector and the second detector respectively include amplifiers; and
 the signal calculation unit, which performs addition, subtraction, and multiplication using output signals from the amplifiers, obtains
  a high pass detection signal using an output signal from the first small detector, and
  a low pass detection signal and a band pass detection signal by amplifying respective output signals of the first small detector and the second small detector, both of which have the same sized detection solid angles but do not have the same energy sensitivities, and performing difference calculation.

14. A charged particle beam apparatus comprising:
 a charged particle source to generate a charged particle beam;
 a specimen holder on which a specimen, to which the charged particle beam is to be irradiated, is mounted;
 an objective lens to converge the charged particle beam onto the specimen;
 a charged particle detector to detect secondary charged particles and backscattered charged particles from a specimen; and
 a signal calculation unit to process an output signal from the charged particle detector, wherein
  the charged particle detector includes a first small detector having a first detection sensitivity and a second small detector having a second detection sensitivity higher than the first detection sensitivity, and
  the charged particle detector makes detection solid angles viewed from a position on the specimen, to which the charged particle beam is to be irradiated, for the first small detector and for the second small detector to be the same.

15. The charged particle beam apparatus according to claim 14, wherein the objective lens is an out-lens type objective lens.

16. The charged particle beam apparatus according to claim 14, wherein the objective lens is a semi-in-lens type objective lens.

17. The charged particle beam apparatus according to claim 14, wherein the objective lens is an in-lens type objective Lens.

* * * * *